(12) United States Patent
Klimov

(10) Patent No.: US 11,929,443 B1
(45) Date of Patent: Mar. 12, 2024

(54) MULTILAYERED LUMINESCENT SOLAR CONCENTRATORS BASED ON ENGINEERED QUANTUM DOTS

(71) Applicant: US Department of Energy, Washington, DC (US)

(72) Inventor: Victor Klimov, Los Alamos, NM (US)

( * ) Notice: Subject to any disclaimer, the term of this patent is extended or adjusted under 35 U.S.C. 154(b) by 649 days.

(21) Appl. No.: 16/228,193

(22) Filed: Dec. 20, 2018

Related U.S. Application Data

(60) Provisional application No. 62/608,929, filed on Dec. 21, 2017.

(51) Int. Cl.
| | |
|---|---|
| *H01L 31/055* | (2014.01) |
| *H01L 31/0296* | (2006.01) |
| *H01L 31/0304* | (2006.01) |
| *H01L 31/032* | (2006.01) |
| *H01L 31/0352* | (2006.01) |
| *H01L 31/072* | (2012.01) |

(52) U.S. Cl.
CPC .. *H01L 31/035218* (2013.01); *H01L 31/0296* (2013.01); *H01L 31/0304* (2013.01); *H01L 31/0322* (2013.01); *H01L 31/055* (2013.01); *H01L 31/072* (2013.01)

(58) Field of Classification Search
CPC ....................... H01L 31/035218; H01L 31/055
See application file for complete search history.

(56) References Cited

U.S. PATENT DOCUMENTS

| | | | | |
|---|---|---|---|---|
| 4,110,123 | A * | 8/1978 | Goetzberger | H01L 31/0547 252/301.36 |
| 8,866,001 | B1 * | 10/2014 | Ziegler | H01L 31/056 136/247 |
| 2009/0056791 | A1 * | 3/2009 | Pfenninger | H01L 31/055 136/247 |
| 2009/0317044 | A1 * | 12/2009 | Buretea | H01S 3/0632 977/932 |
| 2010/0224248 | A1 * | 9/2010 | Kenney | H01L 31/055 136/259 |

(Continued)

FOREIGN PATENT DOCUMENTS

| | | | | |
|---|---|---|---|---|
| WO | WO-2009108408 | A2 * | 9/2009 | ......... H01L 31/0547 |
| WO | WO-2015002995 | A1 * | 1/2015 | ........... C09K 11/025 |

OTHER PUBLICATIONS

Currie et al., "High-Efficiency Organic Solar Concentrators for Photovoltaics," Science Jul. 11, 2008: vol. 321, Issue 5886, pp. 226-228 (Year: 2008).*

(Continued)

*Primary Examiner* — Angelo Trivisonno
(74) *Attorney, Agent, or Firm* — Carmen Piliekstrom; James Durkis; Brian Lally

(57) ABSTRACT

Luminescent solar concentrators (LSCs) based on engineered quantum dots (QDs) are disclosed that include at least one lower band-gap energy LSC layer and at least one higher band-gap energy LSC layer. The higher band-gap energy LSC layer has a higher internal quantum efficiency (IQE) than the lower band-gap energy LSC layer. The lower band-gap energy LSC layer may broadly absorb the remainder of the solar spectrum that is not absorbed by previous layers. An external optical efficiency (EQE) of at least 6%, and in some cases, more than 10%, may be achieved by such LSCs.

11 Claims, 31 Drawing Sheets

(56) References Cited

U.S. PATENT DOCUMENTS

2017/0218264 A1* 8/2017 Klimov .............. B82Y 30/00

OTHER PUBLICATIONS

Goetzberger et al., "Solar Energy Conversion with Fluorescent Collectors," Appl. Phys. 14, 123-139 (1977) (Year: 1977).*

Chatten et al., "Characterising quantum dot concentrators," Conference Record of the Twenty-Eighth IEEE Photovoltaic Specialists Conference—2000 (Cat. No. 00CH37036), 10.1109/PVSC.2000. 916020 (Year: 2000).*

Shen et al., "Synthesis of highly fluorescent InP/ZnS small-core/thick-shell tetrahedral-shaped quantum dots for blue light-emitting diodes," J. Mater. Chem. C, 2017, 5, 8243-8249 (Year: 2017).*

Jang et al., "Interface control of electronic and optical properties in IV-VI and II-VI core/shell colloidal quantum dots: a review," Chem. Commun., 2017, 53, 1002-1024 (Year: 2017).*

Levchuk et al., "Industrially scalable and cost-effective Mn2+ doped ZnxCd1-xS/ZnS nanocrystals with 70% photoluminescence quantum yield, as efficient down-shifting materials in photovoltaics," Energy Environ. Sci., 2016, 9, 1083-1094 (Year: 2016).*

Li et al., "Large Stokes Shift and High Efficiency Luminescent Solar Concentrator Incorporated with CuInS2/ZnS Quantum Dots," Scientific Reports vol. 5, Article No. 17777 (2015) (Year: 2015).*

Goetzberger ("Solar Energy Conversion with Fluorescent Collectors") Appl. Phys. 14, 123-139 (1977) (Year: 1977).*

Xu, "Final Report on Photonic Devices Based on Surface and Composition-Engineered Infrared Colloidal Nanocrystals," U.S. Army Research Office (Year: 2012).*

Erickson, "Zero-Reabsorption Doped-Nanocrystal Luminescent Solar Concentrators," ACS Nano 2014, 8, 4, 3461-3467 (Year: 2014).*

Yarema, O. et al. Highly luminescent, size- and shape-tunable copper indium selenide based colloidal nanocrystals. Chem. Mater. 25, 3753-3757 (2013).

Zang, H. el al. Thick-shell CuInS2/ZnS quantum dots with suppressed "blinking" and narrow single-particle emission line widths. Nano Lett. 17, 1787-1795 (2017).

Zhang, A. et al. Non-blinking (Zn)CuInS/ZnS quantum dots prepared by in situ interfacial alloying approach. Sci. Rep. 5, 15227 (2015).

Zhao, H. et al. Absorption enhancement in "giant" core/alloyed-shell quantum dots for luminescent solar concentrator. Small 12, 5354-5365 (2016).

Zhao, H., Zhou, Y., Benetti, D., Ma, D. & Rosei, F. Perovskite quantum dots integrated in large-area luminescent solar concentrators. Nano Energy 37, 214-223 (2017).

Zhao, Y. & Lunt, R.R. Transparent luminescent solar concentrators for large-area solar windows enabled by massive Stokes-shift nanocluster phosphors. Adv. Energ. Mater. 3, 1143-1148 (2013).

Zhao, Y., Meek, G.A., Levine, B.G. & Lunt, R.R. Near-infrared harvesting transparent luminescent solar concentrators. Adv. Opt. Mater. 2, 606-611 (2014).

Zhou, Y. et al. "Near infrared, highly efficient luminescent solar concentrators", Adv. Energ. Mater. 6, 1501913 (2016).

Batchelder, J.S., Zewail, A.H. & Cole, T. Luminescent solar concentrators .1. Theory of operation and techniques for performance evaluation. Appl. Opt. 18, 3090-3110(1979).

Beaulac, R., Archer, P.I. & Gamelin, D.R. Luminescence in colloidal Mn2+-doped semiconductor nanocrystals. J. Solid State Chem. 181, 1582-1589 (2008).

Bomm, J. et al. Fabrication and full characterization of state-of-the-art quantum dot luminescent solar concentrators. Sol. Energ. Mat. Sol. Cells 95, 2087-2094 (2011).

Bradshaw, L.R., Knowles, K.E., McDowall, S. & Gamelin, D.R. Nanocrystals for luminescent solar concentrators. Nano Lett. 15, 1315-1323 (2015).

Bronstein, N.D. et al. Quantum dot luminescent concentrator cavity exhibiting 30-fold concentration. ACS Photonics 2, 1576-1583 (2015).

Cambié, D., Zhao, F., Hessel, V., Debije, M.G. & Noël, T. A leaf-inspired luminescent solar concentrator for energy-efficient continuous-flow photochemistry. Angew. Chem. Int. Edit. 56, 1050-1054 (2017).

Chatten, A.J., Barnham, K.W.J., Buxton, B.F., Ekins-Daukes, N.J. & Malik, M.A. A new approach to modelling quantum dot concentrators. Sol. Energ. Mat. Sol. Cells 75, 363-371 (2003).

Coropceanu, I. & Bawendi, M.G. Core/shell quantum dot based luminescent solar concentrators with reduced reabsorption and enhanced efficiency. Nano Lett. 14, 4097-4101 (2014).

Currie, M.J., Mapel, J.K., Heidel, T.D., Goffri, S. & Baldo, M.A. High-efficiency organic solar concentrators for photovoltaics. Science 321, 226-228 (2008).

Debije, M.G. & Verbunt, P.P.C. Thirty years of luminescent solar concentrator research: solar energy for the built environment. Adv. Energ. Mater. 2, 12-35 (2012).

Du, J. et al. Zn—Cu—In—Se Quantum dot solar cells with a certified power conversion efficiency of 11.6%. J. Am. Chem. Soc. 138, 4201-4209 (2016).

Erickson, C.S. et al. Zero-reabsorption doped-nanocrystal luminescent solar concentrators. ACS Nano 8, 3461-3467 (2014).

Goetzberger, A. & Greube, W. Solar energy conversion with fluorescent collectors. Appl. Phys. 14, 123-139 (1977).

Goldschmidt, J.C. et al. Increasing the efficiency of fluorescent concentrator systems. Sol. Energ. Mat. Sol. Cells 93, 176-182 (2009).

Green, M.A., Emery, K., Hishikawa, Y., Warta, W. & Dunlop, E.D. Solar cell efficiency tables (version 42). Prog. Photovolt. Res. Appl. 21, 827-837 (2013).

Gutierrez, G.D., Coropceanu, I., Bawendi, M.G. & Swager, T.M. A low reabsorbing luminescent solar concentrator employing pi-conjugated polymers. Adv. Mater. 28, 497-501 (2016).

Klimov, V.I., Baker, T.A., Lim, J., Velizhanin, K.A. & McDaniel, H. Quality factor of luminescent solar concentrators and practical concentration limits attainable with semiconductor quantum dots. ACS Photonics 3, 1138-1148 (2016).

Knowles, K.E., Kilburn, T.B., Alzate, D.G., McDowall, S. & Gamelin, D.R. Bright CuInS2/CdS nanocrystal phosphors for high-gain full-spectrum luminescent solar concentrators. Chem. Commun. 51, 9129-9132 (2015).

Knowles, K.E., Nelson, H.D., Kilburn, T.B. & Gamelin, D.R. Singlet-triplet splittings in the luminescent excited states of colloidal Cu+:CdSe, Cu+:InP, and CuInS2 nanocrystals: charge-transfer configurations and self-trapped excitons. J. Am. Chem. Soc. 137, 13138-13147 (2015).

Krumer, Z. et al. Tackling self-absorption in luminescent solar concentrators with type-II colloidal quantum dots. Sol. Energ. Mat. Sol. Cells 111, 57-65 (2013).

Levchuk, I. et al. Industrially scalable and cost-effective Mn2+ doped ZnxCd1-xS/ZnS nanocrystals with 70% photoluminescence quantum yield, as efficient down-shifting materials in photovoltaics. Energy Environ. Sci. 9, 1083-1094 (2016.

Lewis, N.S. Research opportunities to advance solar energy utilization. Science 351, 10.1126/science.aad1920 (2016).

Li, C. et al. Large Stokes shift and high efficiency luminescent solar concentrator incorporated with CuInS2/ZnS Quantum Dots. Sci. Rep. 5, 17777 (2015).

Li, H., Wu, K., Lim, J., Song, H.-J. & Klimov, V.I. Doctor-blade deposition of quantum dots onto standard window glass for low-loss large-area luminescent solar concentrators. Nat. Energy 1, 16157 (2016).

Li, L. et al. Efficient synthesis of highly luminescent copper indium sulfide-based core/shell nanocrystals with surprisingly long-lived emission. J. Am. Chem. Soc. 133, 1176-1179 (2011).

Lunt, R.R. Theoretical limits for visibly transparent photovoltaics. Appl. Phys. Lett. 101, 043902 (2012).

McDaniel, H. et al. Simple yet versatile synthesis of CuInSexS2-x quantum dots for sunlight harvesting. J. Phys. Chem. C 118, 16987-16994 (2014).

Meinardi, F. et al. Highly efficient large-area colourless luminescent solar concentrators using heavy-metal-free colloidal quantum dots. Nat. Nanotechnol. 10,878-885 (2015).

(56) References Cited

OTHER PUBLICATIONS

Meinardi, F. et al. Highly efficient luminescent solar concentrators based on earth-abundant indirect-bandgap silicon quantum dots. Nat. Photon. 11, 177-185 (2017).
Meinardi, F. et al. Large-area luminescent solar concentrators based on 'Stokes-shift-engineered' nanocrystals in a mass-polymerized PMMA matrix. Nat. Photon. 8, 392-399 (2014).
Nikolaidou, K. et al. Hybrid perovskite thin films as highly efficient luminescent solar concentrators. Adv. Opt. Mater. 4, 2126-2132 (2016).
Panthani, M.G. et al. CuInSe2 quantum dot solar cells with high open-circuit voltage. J. Phys. Chem. Lett. 4, 2030-2034 (2013).
Pietryga, J.M. et al. Spectroscopic and device aspects of nanocrystal quantum dots. Chem. Rev. 116, 10513-10622 (2016).
Pritchard, J., Simon, K., Dowd, C. & Joshi, E. Solar power concentrators for space applications. PAM Rev. Energy Sci. Tech. 3, 2-26 (2016).
Rice, W.D., McDaniel, H., Klimov, V.I. & Crooker, S.A. Magneto-optical properties of CuInS2 nanocrystals. J. Phys. Chem. Lett. 5, 4105-4109 (2014).
Rurack, K. & Spieles, M. Fluorescence quantum yields of a series of red and near-infrared dyes emitting at 600?1000 nm. Anal. Chem. 83, 1232-1242 (2011).
Santra, P.K. & Kamat, P.V., "Tandem-layered quantum dot solar cells: tuning the photovoltaic response with luminescent ternary cadmium chalcogenides", J. Am. Chem. Soc. 135, 877-885 (2013).
Sholin, V., Olson, J.D. & Carter, S.A. Semiconducting polymers and quantum dots in luminescent solar concentrators for solar energy harvesting. J. Appl. Phys. 101, 123114 (2007).
Slooff, L.H. et al. A luminescent solar concentrator with 7.1% power conversion efficiency. Phys. Status Solidi Rapid Res. Lett. 2, 257-259 (2008).
Sumner, R. et al. Analysis of optical losses in high-efficiency CuInS2-based nanocrystal luminescent solar concentrators: balancing absorption versus scattering. J. Phys. Chem. C 121, 3252-3260 (2017).
Takamoto, T., Ikeda, E., Kurita, H. & Ohmori, M. Over 30% efficient InGaP/GaAs tandem solar cells. Appl. Phys. Lett. 70, 381-383 (1997).
Tuchinda, C., Srivannaboon, S. & Lim, H.W. Photoprotection by window glass, automobile glass, and sunglasses. J. Am. Acad. Dermatol. 54, 845-854 (2006).
Tummeltshammer, C. et al. On the ability of Förster resonance energy transfer to enhance luminescent solar concentrator efficiency. Nano Energy 32, 263-270 (2017).
Van Sark, W.G.J.H. M. et al. Luminescent solar concentrators—a review of recent results. Opt. Express 16, 21773-21792 (2008).
Vos, A.D. Detailed balance limit of the efficiency of tandem solar cells. J Phys. D: Appl. Phys. 13, 839 (1980).
Vossen, F.M., Aarts, M.P.J. & Debije, M.G. Visual performance of red luminescent solar concentrating windows in an office environment. Energy Build. 113, 123-132 (2016).
Weber, W. & Lambe, J. Luminescent greenhouse collector for solar radiation. Appl. Opt. 15, 2299-2300 (1976).
Wilson, L.R., Klampaftis, E. & Richards, B.S. Enhancement of power output from a large-area luminescent solar concentrator with 4.8?concentration via solar cell current matching. IEEE J. Photovolt. 7, 802-809 (2017).
Wittwer, V., Stahl, W. & Goetzberger, A. Fluorescent planar concentrators. Sol. Energ. Mater. 11, 187-197 (1984).

\* cited by examiner

400

800

2400

2410

MULTILAYERED LUMINESCENT SOLAR CONCENTRATORS BASED ON ENGINEERED QUANTUM DOTS

CROSS-REFERENCE TO RELATED APPLICATION

This application claims the benefit of U.S. Provisional Patent Application No. 62/608,929 filed Dec. 21, 2017. The subject matter of this earlier-filed application is hereby incorporated by reference in its entirety.

STATEMENT OF FEDERAL RIGHTS

The United States government has rights in this invention pursuant to Contract No. 89233218CNA000001 between the United States Department of Energy and Triad National Security, LLC for the operation of Los Alamos National Laboratory.

FIELD

The present invention generally relates to luminescent solar concentrators, and more particularly, to luminescent solar concentrators based on engineered quantum dots.

BACKGROUND

Luminescent solar concentrators (LSCs) can serve as large-area sunlight collectors for terrestrial and space-based photovoltaics (PVs). An LSC is typically a slab of a transparent material containing highly emissive fluorophores. Solar photons incident onto a larger-area device face (area $A_1$) are absorbed by the fluorophores, reemitted at a longer wavelength, and guided by total internal reflection to the device edges (area $A_2$), where they are collected by PV cells. The ratio between $A_1$ and $A_2$ defines a geometric gain factor G, which is linked to a concentration factor C by $C=\eta_{s,ext}G$, where $\eta_{s,ext}$ is the internal quantum efficiency of the LSC equal to the ration of the edge-collected photon flux $\Phi_2$ and the total incident solar flux $\Phi_{s,1}$. C can be thought of as an effective expansion coefficient of the active area of a solar cell, and if C is greater than unity, then the use of an LSC can boost the photocurrent, and thus the generated power. Furthermore, if the cost per unit of area of an LSC is considerably lower than that of a PV module, this scheme can provide a reduction in the cost of solar electricity.

The LSC concept has primarily been explored with a focus on dye molecules. Ordinary dyes, however, suffer from limited spectral coverage of the solar spectrum, low photoluminescence (PL) efficiencies at near-infrared (NIR) wavelengths most suitable for coupling to silicon PVs, and strong losses to reabsorption. The latter problem can be alleviated using, for instance, triplet emission or cascaded energy transfer that can help spectrally displace the PL versus the absorption spectrum.

Interesting new classes of LSC emitters introduced recently are highly emissive perovskites, nanocluster phosphors, and colloidal quantum dots (QDs). Colloidal nanocrystals offer unparalleled level of tunability of their absorption and emission spectra, combined with high photostability and high PL quantum yield ($\eta_{PL}$) across the visible and NIR wavelengths. Importantly, the major efficiency loss mechanism associated with self-absorption can be effectively tackled by a variety of strategies (commonly referred to as "Stokes-shift engineering") that include specially designed hetero-structured QDs, impurity-doped structures, indirect-band-gap QDs, QDs emitting via intra-gap native defects, and hybrid QD-dye systems.

Quantum dots (QDs) have been utilized to develop fairly efficient single-layer luminescent solar concentrators (LSCs). One of the best performing devices reported by Los Alamos National Laboratory (LANL) researchers in 2015 demonstrated external optical efficiency (EQE) of ~3.6%. While being the record value for this type of devices, the observed efficiency was still below the threshold for commercial viability of LSCs. Based on a cost/efficiency analysis of photovoltaic (PV)-only and coupled LSC-PV devices, it has been concluded that the break-even point for these two types of systems is achieved when the EQE for LSCs is ~6%. The current state-of-the-art of QD-LSCs does not reach such efficiencies with single-layer devices. Accordingly, an improved QD-LSC design may be beneficial.

SUMMARY

Certain embodiments of the present invention may provide solutions to the problems and needs in the art that have not yet been fully identified, appreciated, or solved by conventional luminescent solar concentrators. For example, some embodiments of the present invention pertain to LSCs based on engineered QDs. An EQE of at least 6%, and in some cases, more than 10%, is achieved in some embodiments using LSC devices with two or more layers.

In an embodiment, an LSC device includes a lower band-gap energy bottom LSC layer and a higher band-gap energy top LSC layer positioned above the lower band-gap energy bottom LSC layer. The higher band-gap energy top LSC layer has a higher band-gap energy than the lower band-gap energy bottom LSC layer. The higher band-gap energy top LSC layer also has a higher internal quantum efficiency (IQE) than the lower band-gap energy bottom LSC layer.

In another embodiment, an LSC device includes a lower band-gap energy bottom LSC layer, a higher band-gap energy top LSC layer positioned above the lower band-gap energy bottom LSC layer, and an intermediate band-gap energy intermediate LSC layer positioned between the lower band-gap energy bottom LSC layer and the higher band-gap energy top LSC layer. The higher band-gap energy top LSC layer has a higher band-gap energy than the intermediate band-gap energy intermediate LSC layer, which has a higher band-gap energy than the lower band-gap energy bottom LSC layer. The higher band-gap energy top LSC layer has a higher IQE than the intermediate band-gap energy intermediate LSC layer, which has a higher IQE than the lower band-gap energy bottom LSC layer.

In yet another embodiment, an LSC device includes a lower band-gap energy bottom LSC layer and a higher band-gap energy top LSC layer positioned above the lower band-gap energy bottom LSC layer. The higher band-gap energy top LSC layer has a higher band-gap energy than the lower band-gap energy bottom LSC layer. The higher band-gap energy top LSC layer also has a higher IQE than the lower band-gap energy bottom LSC layer. The higher band-gap energy top LSC layer includes one or more of the following: wide band-gap nanocrystals (NCs) of II-VI, III-V, I-III-$VI_2$ semiconductors, all-inorganic perovskites and organic-inorganic hybrid perovskites including alloyed compounds prepared as spherical QDs, nanorods, nanoplatelets, and/or tetrapods, heterostructured nanocrystals including two or more combinations of II-VI, III-V, I-III-$VI_2$ semiconductors and their alloys, prepared as core/shell NCs, hetero-nanorods, hetero-nanoplatelets, and/or hetero-tetrapods, and/or NCs doped with emissive impurities. The lower band-gap energy bottom LSC layer includes nanocrystals of narrow band-gap semiconductors including CdTe, PbSe, PbS, PbSe$_x$S$_{1-x}$, CuInS$_2$, a CuInS$_2$—ZnS alloy, CuInSe$_2$, a CuInSe$_2$—ZnS alloy, CuInSe$_x$S$_{2-x}$, a CuInSe$_2$—ZnSeS alloy, AgInS$_2$, AgInSe$_2$, AgInSe$_x$S$_2$, Si, Ge, a Si—Ge alloy, and/or GaAs, any combination thereof, or heterostructures based on a combination of any of the previous materials with one or more wider band-gap materials including core/shell PbSe/CdSe QDs, PbS/CdS QDs, CuInS$_2$/ZnS QDs, CuInSe$_2$/ZnSe QDs, and/or CuInSe$_2$—ZnSe/ZnS QDs.

BRIEF DESCRIPTION OF THE DRAWINGS

In order that the advantages of certain embodiments of the invention will be readily understood, a more particular description of the invention briefly described above will be rendered by reference to specific embodiments that are illustrated in the appended drawings. While it should be understood that these drawings depict only typical embodiments of the invention and are not therefore to be considered to be limiting of its scope, the invention will be described and explained with additional specificity and detail through the use of the accompanying drawings, in which.

Figure 1:
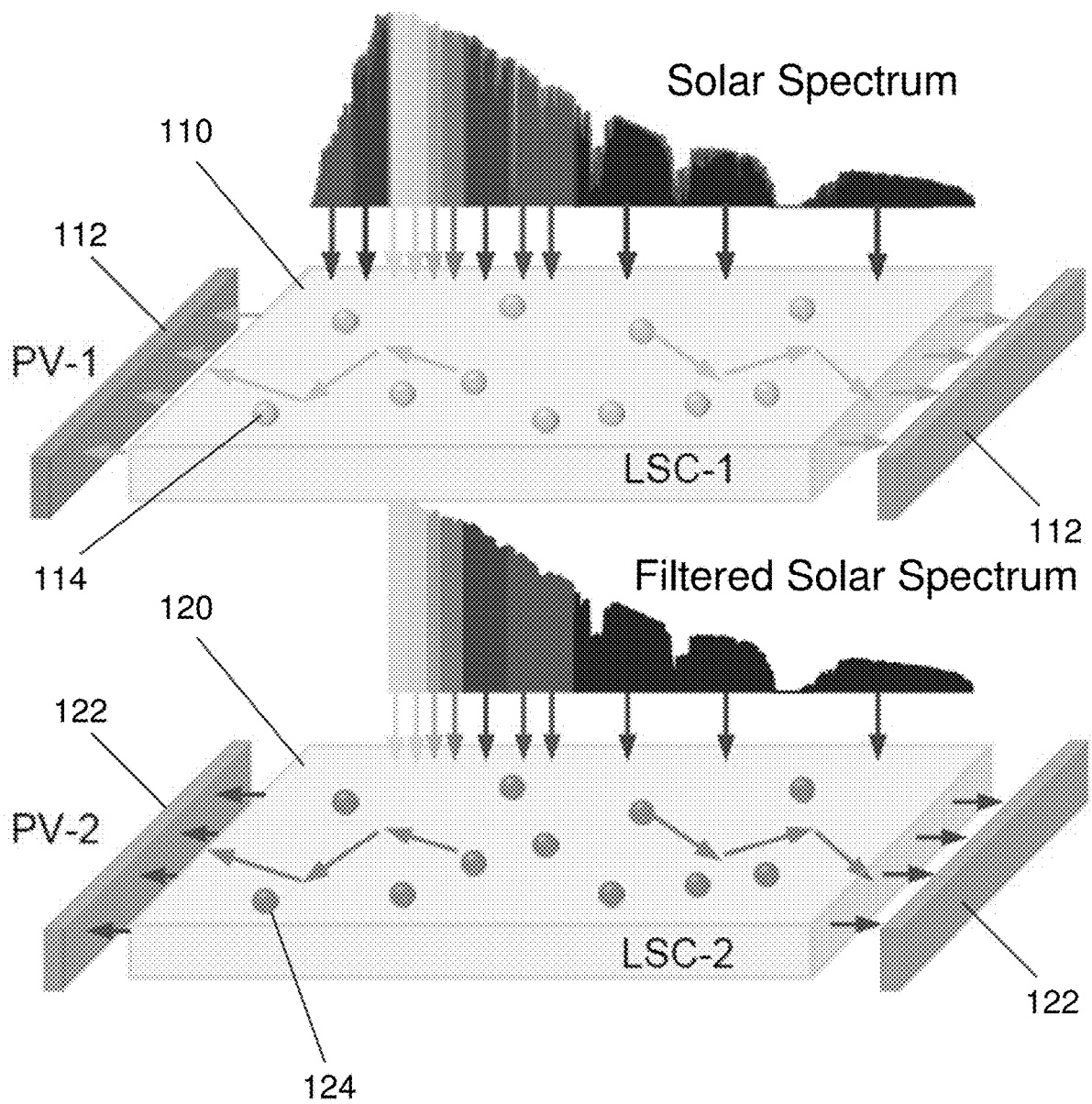
FIG. 1 is a separated perspective view illustrating a two-layer (tandem) LSC, according to an embodiment of the present invention.

for the bottom-layer (solid) and tandem devices (dashed) for presently available (darker gray) and projected (lighter gray) PL quantum yields ($\eta_{PL}$), according to an embodiment of the present invention.

DETAILED DESCRIPTION OF THE EMBODIMENTS

Some embodiments of the present invention pertain to LSCs based on engineered QDs. An EQE of at least 6%, and in some cases, more than 10%, is achieved in some embodiments using devices or LSCs with two or more layers. QDs with varied band gaps are well suited for realizing multi-layered LSCs, where each layer is designed so as to absorb a different part of the solar spectrum. The bottom layer may broadly absorb the remainder of the solar spectrum that is not absorbed by previous layers.

LSCs can serve as large-area sunlight collectors for terrestrial and space-based photovoltaics (PVs). Due to their high emission efficiencies and readily tunable emission and absorption spectra, colloidal QDs have emerged as a new type of promising LSC fluorophores. Spectral tunability of the QDs also facilitates the realization of stacked multi-layered LSCs, where the enhanced performance is obtained through spectral splitting of incident sunlight, as in multi-junction PVs.

Some embodiments pertain to two-layer (i.e., "tandem") LSCs that utilize QDs of two different types to selectively harvest the higher-energy and the lower-energy portions of the solar spectrum. A tandem LSC uses quantum dots of two different types. In some embodiments, the top layer absorbs the blue and ultraviolet portions of the solar spectrum, while the rest of the spectrum is picked up by the bottom layer. For instance, the top layer in some embodiments is based on wide-band-gap Manganese (Mn)-doped II-VI QDs, while the bottom layer utilizes narrow-band-gap $CuInSe_2$ QDs.

Using the proposed approach of spectral splitting can, in principle, achieve a considerable boost in the device efficiency compared to single-layer structures. One benefit of this approach is that the higher-energy photons can generate a higher photovoltage, which could boost the overall power output. Furthermore, this approach can also improve the photocurrent if the internal quantum efficiency (IQE) of the top layer is higher than that of the bottom layer. Ideally, the dots used in the top layer are virtually "reabsorption free."

Per the above, to achieve this "reabsorption-free" behavior, Mn-doped II-VI QDs can be used, where ions of Mn serve as emission centers, where the QDs act as light harvesting "antennae." Mn impurities are activated by energy transfer from the host QDs. Following activation, they emit light at energies below the quantum-dot absorption onset. This approach allows for almost complete elimination of losses due to self-absorption by the QDs.

In a proof-of-principle demonstration of a tandem LSC, narrow band-gap $CuInSe_2$ (CISe)-based QDs were used in the bottom layer. These QDs exhibited strong absorptance (~30%) across the solar spectrum and a high emission quantum yield (QY) of 65-75%. The top LSC layer was based on highly emissive $Mn^{2+}$-doped $Cd_xZn_{1-x}S$-based QDs (QY=78%) with the absorption onset at ~440 nm. As discussed above, due to efficient excitation transfer from the semiconductor host to the emissive $Mn^{2+}$ ions, light emission in these structures occurs in a reabsorption-free intra-gap region, which results in an extremely high IQE of >50%. As a result, the high-energy portion of the solar spectrum harvested by the top layer is converted into the output flux much more efficiently than in the bottom layer, which results in an approximately 21% improvement in overall device efficiency. The fabricated large-area tandem LSCs (15.24× 15.24 $cm^2$) exhibited EQEs up to 6.4%, which was an absolute record for any type of LSCs of similar sizes, whether based on dye molecules or QDs.

To evaluate the cost effectiveness of the developed tandem devices, a comparison of the per-watt (W) cost of solar electricity between the standalone silicon (Si)-PV and the coupled LSC-PV system was performed. This was characterized in terms of the LSC cost-efficiency factor. Based on this analysis, the cost-efficiency factor for the demonstration tandem LSC is 0.87, indicating that the LSC-PV system utilizing these devices can, in principle, be more cost efficient (by ~13%) compared to existing Si PV-modules. By further optimizing LSC dimensions and absorptance of the top and bottom layers, the cost savings can be boosted to ~34%. These results suggest that QD-based tandems and more complex multi-layered LSCs can provide a viable pathway to reducing the cost of solar electricity by complementing the existing PV technology with high-efficiency sunlight collectors deployable either as standalone LSC-PV modules or semi-transparent building-integrated solar windows.

It should be noted that various structures and materials may be used in the LSC layers without deviating from the scope of the invention. For instance, a higher band-gap energy top LSC layer may include, but is not limited to, one or more of the following: wide band-gap nanocrystals (NCs) of II-VI, III-V, I-III-$VI_2$ semiconductors, all-inorganic perovskites and organic-inorganic hybrid perovskites including alloyed compounds prepared as spherical (or nearly spherical) QDs, nanorods, nanoplatelets, tetrapods, and/or other shapes, heterostructured nanocrystals including two or more combinations of II-VI, III-V, I-III-$VI_2$ semiconductors and their alloys, prepared as core/shell NCs, hetero-nanorods, hetero-nanoplatelets, hetero-tetrapods, and/or other shapes, NCs doped with emissive impurities (e.g., Mn and/or Cu ions), or any combination thereof. The higher band-gap energy top LSC layer may include core/shell CdSe/CdS QDs, nanorods, and/or nanoplatelets, core/shell $Cd_xZn_{1-x}Se_yS_{1-y}/ZnSe_zS_{1-z}$ QDs, core/shell InP QDs, core/shell InP/ZnS QDs, Mn-doped $Cd_xZn_{1-x}Se_yS_{1-y}$ QDs, Mn-doped core/shell $Cd_xZn_{1-x}Se_yS_{1-y}/ZnSe_zS_{1-z}$ QDs, Cu-doped $Cd_xZn_{1-x}Se_yS_{1-y}$/QDs, Cu-doped core/shell $Cd_xZn_{1-x}Se_yS_{1-y}/ZnSe_zS_{1-z}$ QDs, or any combination thereof. The lower band-gap energy bottom LSC layer may include, but is not limited to, nanocrystals of narrow band-gap semiconductors including CdTe, PbSe, PbS, $PbSe_xS_{1-x}$, $CuInS_2$, a $CuInS_2$—ZnS alloy, $CuInSe_2$, a $CuInSe_2$—ZnS alloy, $CuInSe_xS_{2-x}$, a $CuInSe_2$—ZnSe alloy, $AgInS_2$, $AgInSe_2$, $AgInSe_xS_2$, Si, Ge, a Si—Ge alloy, and/or GaAs, any combination thereof, or heterostructures based on a combination of any of the previous materials with one or more wider band-gap materials including, for instance, core/shell PbSe/CdSe QDs, PbS/CdS QDs, $CuInS_2$/ZnS QDs, $CuInSe_2$/ZnSe QDs, and/or $CuInSe_2$—ZnSe/ZnS QDs.

Intermediate IQEs between those of the higher band-gap energy top LSC layer and the lower band-gap energy bottom LSC layer may also be achieved. For instance, an intermediate band-gap energy intermediate LSC layer between the top LSC layer and the bottom LSC layer may include core-shell II-VI quantum dots (QDs) with an extra-thick shell (greater than 4 nm in thickness). Such nanocrystals may include CdSe/CdS QDs, CdSe/$Cd_xZn_{1-x}$Se QDs, and/or $Cd_xZn_{1-x}Se_yS_{1-y}/ZnSe_zS_{1-z}$ QDs. Additionally or alternatively, Cu-doped II-VI QDs may be used, such as Cu:$Cd_xZn_{1-x}Se_yS_{1-y}$ QDs, for instance. Additionally or alternatively, Cu-doped core-shell II-VI QDs may be used including, for instance, Cu:CdSe/CdS QDs, Cu:CdSe/ $Cd_xZn_{1-x}Se$ QDs, and/or Cu:$Cd_xZn_{1-x}Se_yS_{1-y}$/$ZnSe_zS_{1-z}$ QDs. It should be noted that any desired number and formulation of intermediate layers may be included without deviating from the scope of the invention.

A separated perspective view of a two-layer LSC device 100 is shown in FIG. 1. In LSC device 100, an upper LSC 110 is surrounded by edge-mounted PVs 112. LSC 110 includes QDs 114 made from one or more materials that absorb a higher energy portion of the solar spectrum. For instance, QDs 114 may absorb a short-wavelength portion of the solar spectrum (e.g., blue and ultraviolet (UV)). The absorption of short-wavelength photons is followed by re-emission of longer wavelength photons that are then guided via total internal reflection within LSC 110 towards PVs 112, where energy therefrom is converted to electricity.

The filtered portion of the solar spectrum that passes through LSC 110 reaches LSC 120, which is also surrounded by edge-mounted PVs 122. LSC 120 includes QDs 124 that absorb a broad spectrum of solar photons. The absorbed photons are reemitted, guided via total internal reflection within LSC 120, and impinge onto PVs 122, where energy therefrom is converted to electricity. In some embodiments, PVs 112, 122 are band-gap-matched solar cells designed for the wavelengths emitted by QDs 114, 124, respectively. However, the overall performance of LSC device 100 is superior to that of a single layer LSC device even with the same type of PVs used for both layers, so long as LSC 110 has a IQE ($\eta_{int}=\Phi_2/\Phi_{s,abs}$, where $\Phi_{s,abs}$ is the absorbed solar flux) than LSC 120.

In FIG. 1, PVs 112, 122 are only shown on two sides of LSCs 110, 120 for illustration purposes. However, it should be understood that typically, LSCs 110, 120 would be surrounded by PVs on all sides in order to increase the amount of photonic energy that can be captured by each LSC. Furthermore, the LSCs need not be square or rectangular. Rather, in some embodiments, they may be any regular or irregular geometric shape or any other shape without deviating from the scope of the invention. In certain embodiments, the LSCs may have varying thicknesses on a constant grade, irregular variations, etc.

Figure 2:
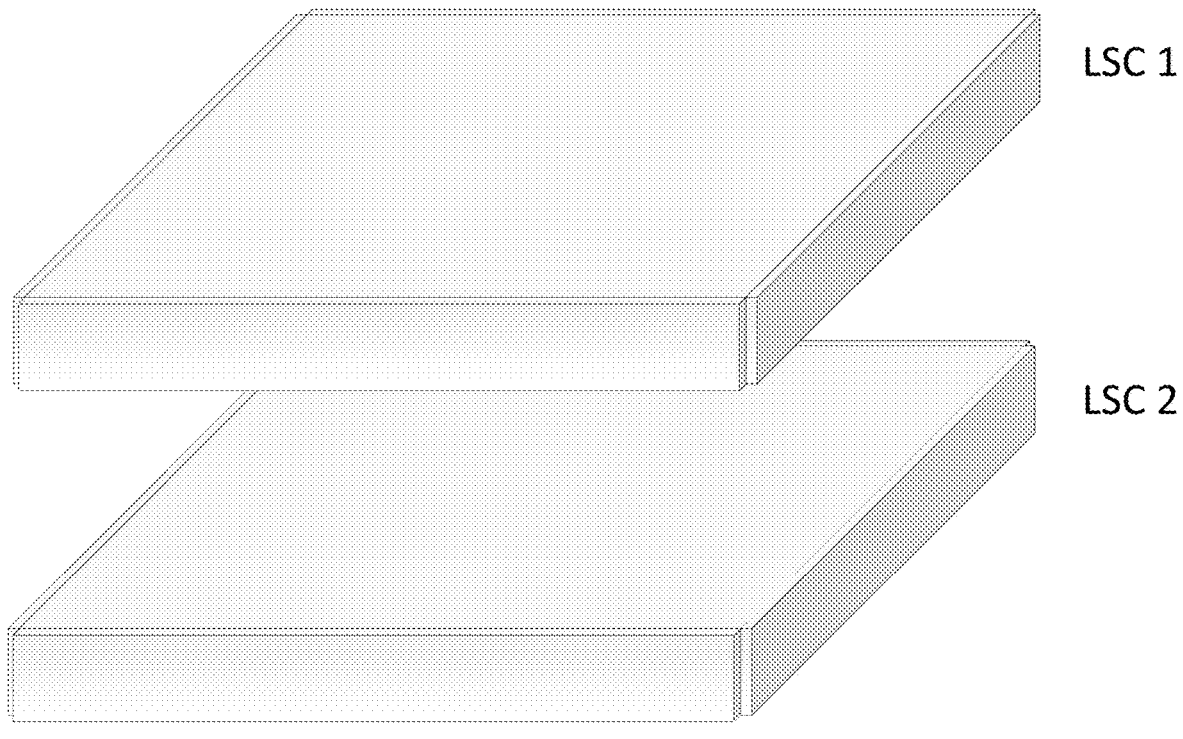
FIG. 2 is a perspective view illustrating a multi-layer LSC with each layer separated from the surrounding layers, according to an embodiment of the present invention.
Figure 2:
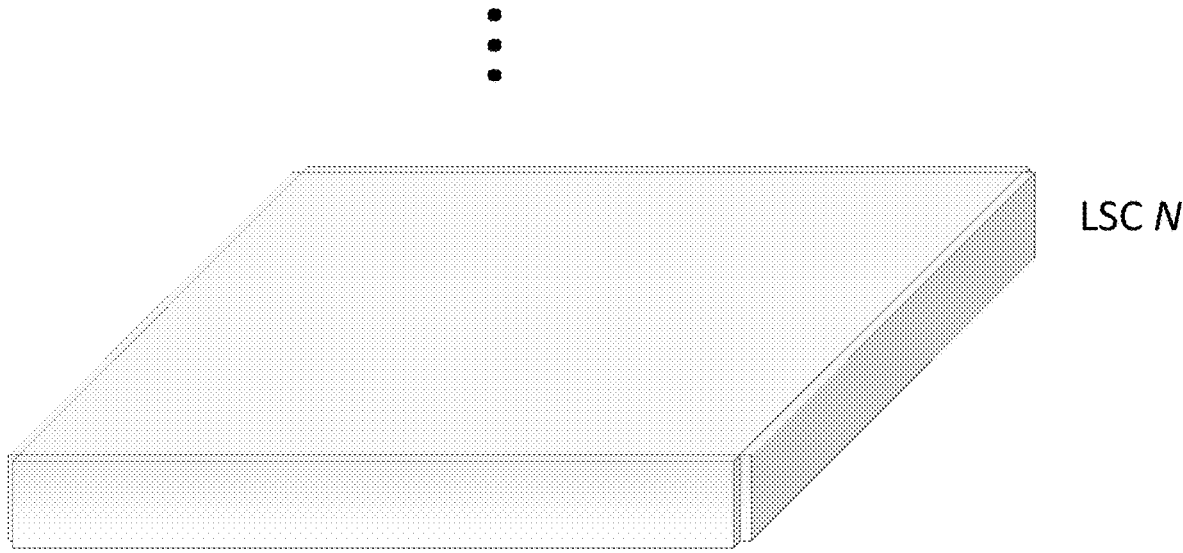

Embodiments are not limited to two layers of LSCs. For instance, in some embodiments, three layers, four layers, or any desired number of layers may be used without deviating from the scope of the invention. Multi-layer LSC device 200 of FIG. 2 illustrates this concept. Each LSC above LSC N absorbs a portion of the solar spectrum. For instance, LSC 1 may absorb blue and UV light, LSC 2 may absorb green and yellow light, and LSC N may absorb red and infrared light. Alternatively, each layer may only absorb portions of the solar spectrum. It should be noted that in some embodiments, any desired portion(s) of the solar spectrum may be absorbed. It should be noted that the top layer should have the highest absorption onset (i.e., the shortest wavelength), the next highest layer should have the next highest absorption onset, and so on, until the bottom layer, which should have the lowest absorption onset (i.e., the longest wavelength).

Large area, high efficiency tandem QD LSCs of some embodiments are fabricated using two types of QDs—one having the absorption onset in the visible range (top layer) and the other in the NIR range (bottom layer). For the bottom layer, narrow band-gap $CuInSe_2$ (CISe)-based QDs may be used that exhibit strong absorptance across the solar spectrum ($\eta_{s,abs}=\Phi_{s,abs}/\Phi_{s,1}$ is up to ~30%) and a high $\eta_{PL}$ of 65-75%. The top LSC layer in some embodiments is based on highly emissive $Mn^{2+}$-doped $Cd_xZn_{1-x}S$-based QDs ($\eta_{PL}$=78%) with the absorption onset at ~440 nm.

Due to efficient excitation transfer from the semiconductor host to the emissive $Mn^{2+}$ ions, PL in these structures occurs in a reabsorption-free intra-gap region, which results in extremely high $\eta_{int}$ of more than 50%. As a result, the high-energy portion of the solar spectrum harvested by the top layer is converted into the output flux much more efficiently than in the bottom layer, which results in the ~21% improvement in $\eta_{s,ext}$, and thus enhanced solar-to-electrical power conversion efficiency (PCE), even with the same type of PVs in both layers. A large area tandem LSC of 15.24×15.24 cm of some embodiments coupled to GaAs solar cells exhibits a PCE of 3.1%, which can be further enhanced to 3.8% using band-gap-matched PVs. This represents a 52% improvement versus a single bottom layer device.

Figure 3:
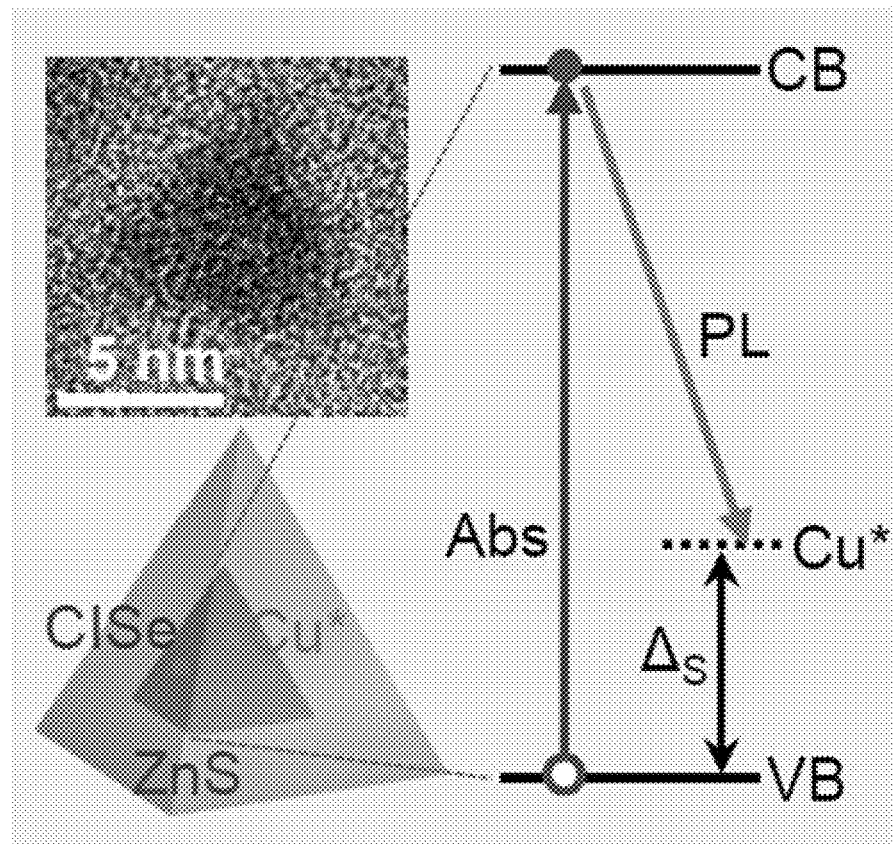
FIG. 3 illustrates a representation for an individual CISe/ZnS QD, according to an embodiment of the present invention.

Bottom LSC Layer $CuInSe_xS_{2-x}$ (CISeS) QDs are well suited for the bottom layer of a tandem or other multi-layer LSC device in some embodiments. Due to their narrow band-gap ($E_g$=1.02 eV for bulk CISe), these QDs allow for improved harvesting of the solar spectrum compared to wider gap II-VI nanostructures. An additional advantage is a large intrinsic Stokes shift ($\Delta_s$) between the PL band and the onset of strong absorption, which reflects the peculiarity of the emission mechanism in CISeS QDs. Due to a relatively large abundance of native defects, the PL in these materials occurs not via a band-to-band transition, but instead involves a transition between a conduction band electron and a localized hole residing in an intra-gap state commonly ascribed to a Cu-related defect. See representation 300 of FIG. 3, which shows a representative transmission electron microscopy (TEM) image (upper right) of an individual CISe/ZnS QD schematically depicted at the bottom left. A simplified representation of electronic states and optical transitions responsible for light absorption and PL is shown on the right. VB and CB denote the valence and conduction bands, respectively, and Cu* is a copper-related defect. As a result, the PL is situated at intra-gap energies, which greatly reduces its overlap with the absorption spectrum. In addition to its favorable spectral characteristics, the CISeS QD PL is characterized by high $\eta_{PL}$ (greater than 50%) even at NIR wavelengths (greater than 800 nm), where common dyes are usually poor emitters with $\eta_{PL}$ below 10%.

Due to the above properties, CISeS QDs have shown strong performance as LSC fluorophores. For example, one 12×12 cm CISeS QD-based device demonstrated a 3.2% optical power conversion efficiency $\eta_{s,p}$, which corresponded to an external quantum efficiency of 3.7%. The two efficiencies are connected by $\eta_{s,p}=(v_{LSC}/v_s)\eta_{s,ext}$, where $v_s$ and $v_{LSC}$ are the average frequencies of the solar and LSC photons, respectively. These high efficiencies were obtained despite a relatively low absorptance of ~20% and a moderate $\eta_{PL}$ of ~40%, suggesting ample room for improvement in $\eta_{s,ext}$ by increasing $\eta_{s,abs}$ and/or $\eta_{PL}$.

Figure 4:
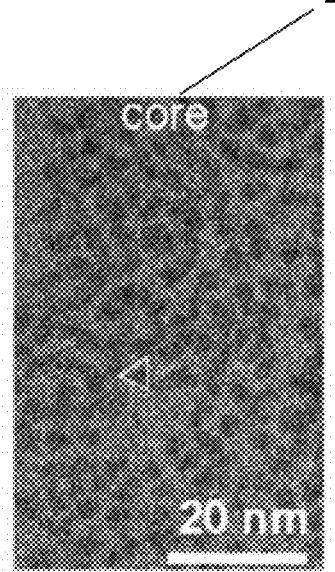
FIG. 4 illustrates tunneling electron microscope (TEM) images and graphs 100 for CuInSe$_2$ cores and CuInSe$_2$/ZnS core/shell QDs, according to an embodiment of the present invention.
Figure 4:
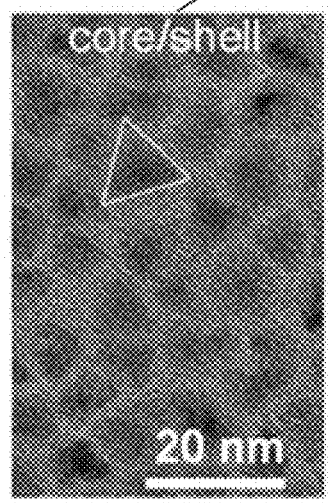

A new type of CISe QDs overcoated with an especially thick ZnS shell has shown a considerable enhancement in $\eta_{PL}$ over conventional thin-shell structures, along with suppressed single-dot PL intermittency and greatly improved photostability. In some embodiments, this thick-shell strategy is extended to CISe QDs that are more suitable for LSC applications due to their narrower band-gap. CISe cores may first be synthesized with the apex-to-apex size of 3.1±0.5 nm and then overcoated with a thick ZnS layer, which increases the overall particle size to 7.9±0.9 nm. See images and graphs 400 of FIG. 4 for $CuInSe_2$ cores and $CuInSe_2$/ZnS core/shell QDs, according to an embodiment of the present invention. TEM images were taken of CuInSe$_2$ cores 410 and CuInSe$_2$/ZnS core/shell QDs 420. Both core and core/shell QDs have tetrahedral shapes. Their sizes are evaluated in terms of the length of a tetrahedral edge. Histograms of QD sizes are also shown for CuInSe$_2$ cores 430 and CuInSe$_2$/ZnS core/shell QDs 440.

Figure 5:
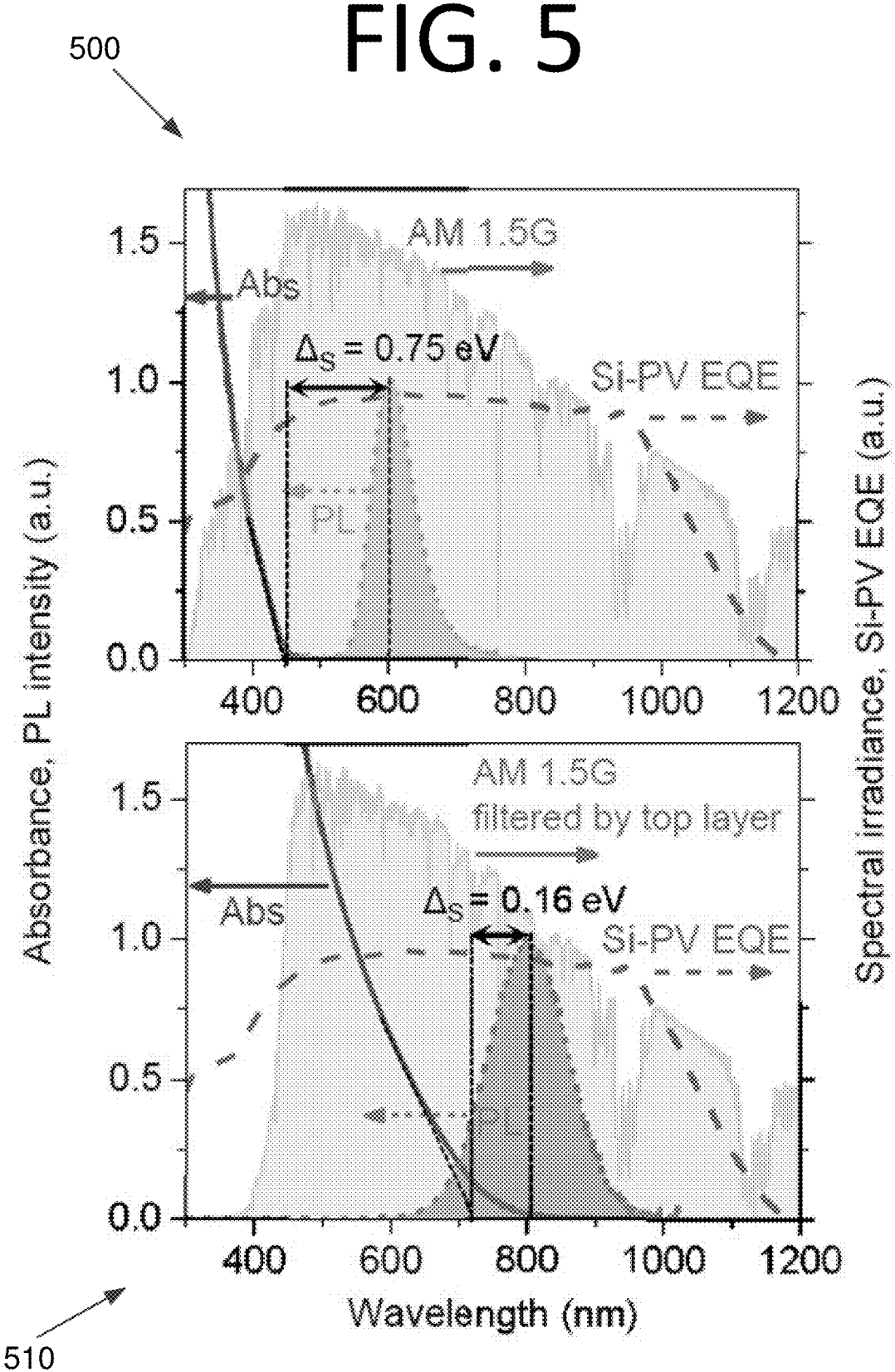
FIG. 5 illustrates spectra of Mn$^{2+}$-doped Cd$_x$Zn$_{1-x}$S/ZnS QDs and CuInSe$_2$/ZnS QDs used in the top LSC and bottom LSC, respectively of FIG. 1, according to an embodiment of the present invention.
Figure 6:
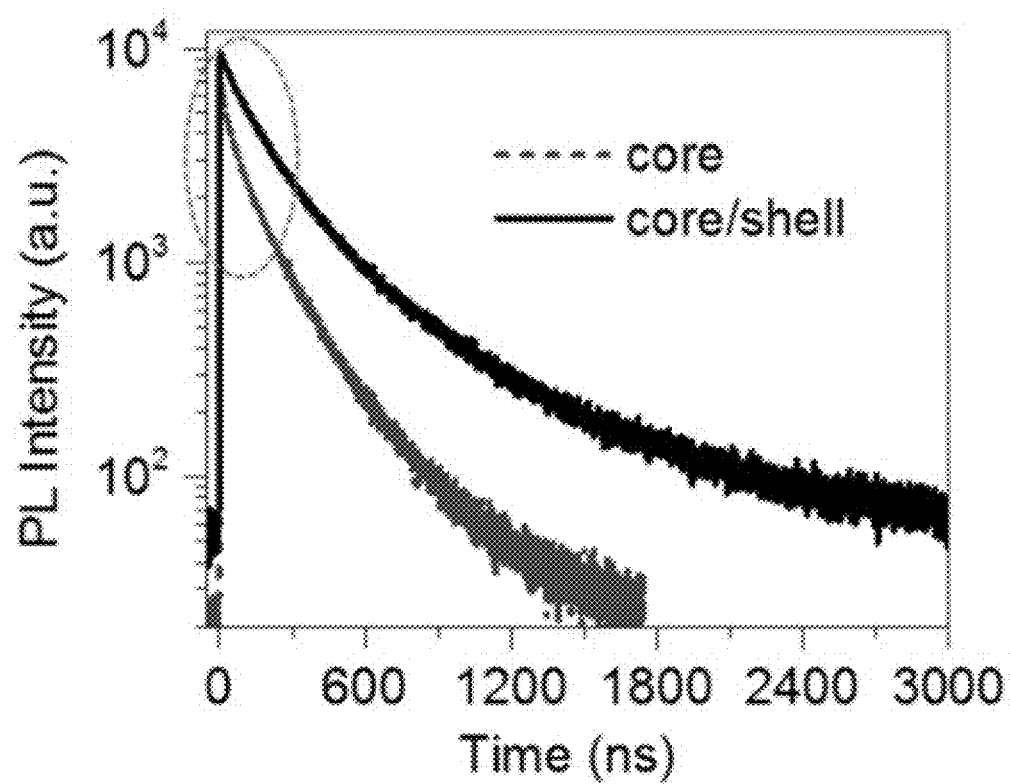
FIG. 6 is a graph illustrating photoluminescence dynamics of CuInSe$_2$ cores and CuInSe$_2$/ZnS core/shell QDs, according to an embodiment of the present invention.

The PL of these QDs is centered at ~805 nm (see graph 510 of FIG. 5) and it shows a large width of ~305 meV (full-width-at-half-maximum (FWHM)), which is typical of these materials. As in the case of CISe QDs, the addition of the thick ZnS shell eliminates fast surface trapping channels (see FIG. 6) and leads to high hPL of 65-75%, maintained upon matrix encapsulation. More specifically, FIG. 6 is a graph 600 illustrating PL dynamics of CuInSe$_2$ cores and CuInSe$_2$/ZnS core/shell QDs, according to an embodiment of the present invention. The excitation source is a 405 nm laser diode with the pulse width of ~1 ns. The thick ZnS shell effectively passivates surface traps, which leads to slower PL dynamics (black) compared to core-only samples (gray).

This is almost a two-fold improvement over the CISeS QDs used in a prior high-performance LSC and ~20% higher than the best literature value for CISe-based QDs. As commonly observed for CISeS QD samples, the absorption spectrum is featureless and exhibits a gradual growth with increasing photon energy after the onset at ~730 nm (see graph 510 of FIG. 5). This is approximately 160 meV higher than the PL peak, which helps alleviate the problem of reabsorption.

Figure 7:
FIG. 7 illustrates a large area CISe/ZnS QD LSC, according to an embodiment of the present invention.

To fabricate the LSCs of some embodiments, a mixture of CISe/ZnS QDs and polyvinylpyrrolidone (PVP) in chloroform was deposited onto a 1.59 mm thick borosilicate glass substrate using a doctor-blade technique. The thickness of the QD/polymer film upon drying is 0.05 mm. FIG. 7 illustrates a large area 15.24×15.24 cm (232 cm$^2$) CISe/ZnS QD LSC 700 with the total sunlight absorptance $\eta_{s,abs}$=28%. The corresponding visible transmittance VT is 23%. See image and graph 800 of FIG. 8, where the image shows solution samples of CISe/ZnS QDs with different sunlight absorptances $\eta_{s,abs}$ from 5% to 30% (left to right) that correspond to visible transmittances from 85.5% to 16.8%, respectively (graph). Thus, LSC 700 of FIG. 7 appears dark to an observer. However, it is still semi-transparent and non-hazy, indicating the absence of QD aggregation or other non-uniformities in the polymer matrix, which explains negligible optical scattering.

Figure 9:
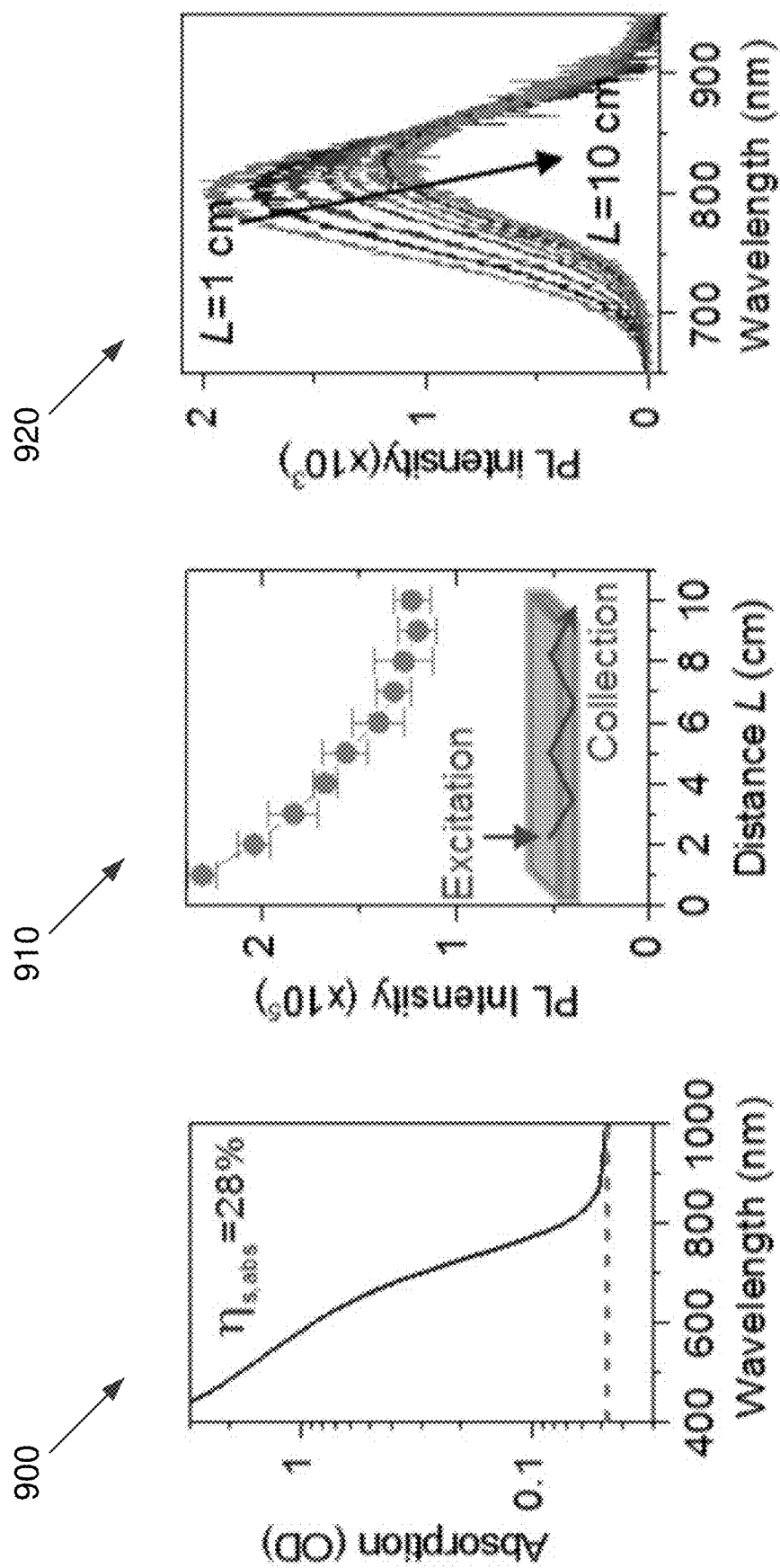
FIG. 9 illustrates graphs of measurements of PL propagation losses in CISe-QD-based LSCs, according to an embodiment of the present invention.

Graph 900 of FIG. 9 shows an absorption spectrum of the LSC showing 28% absorptance ($\eta_{s,abs}$) for incident solar light. The LSC has very weak scattering, as indicated by the fact that the absorption spectrum shows no signatures of optical scattering in the intragap region but only exhibits a small constant offset arising from light reflections (~8% reflectivity). Graph 910 of FIG. 9 shows spectrally integrated intensity of PL emerging from the LSC edge as a function of the distance (L) between the excitation spot and the collection edge (inset). Graph 920 of FIG. 9 shows the L-dependent PL spectra, which show the presence of weak reabsorption on the blue side of the spectra.

The EQE for sunlight illumination ($\eta_{s,ext}$ t) of square-shaped CISe-QD LSCs was measured as a function of their size (L) by two quantitative techniques—one based on integrating-sphere PL measurements and the other based on evaluation of the photocurrent of a PV cell recorded with and without an LSC light collector. The first technique provides detailed insights into the optical loss mechanisms by allowing differentiation between the numbers of photons emitted from the faces versus the edges of the device.

Figure 10:
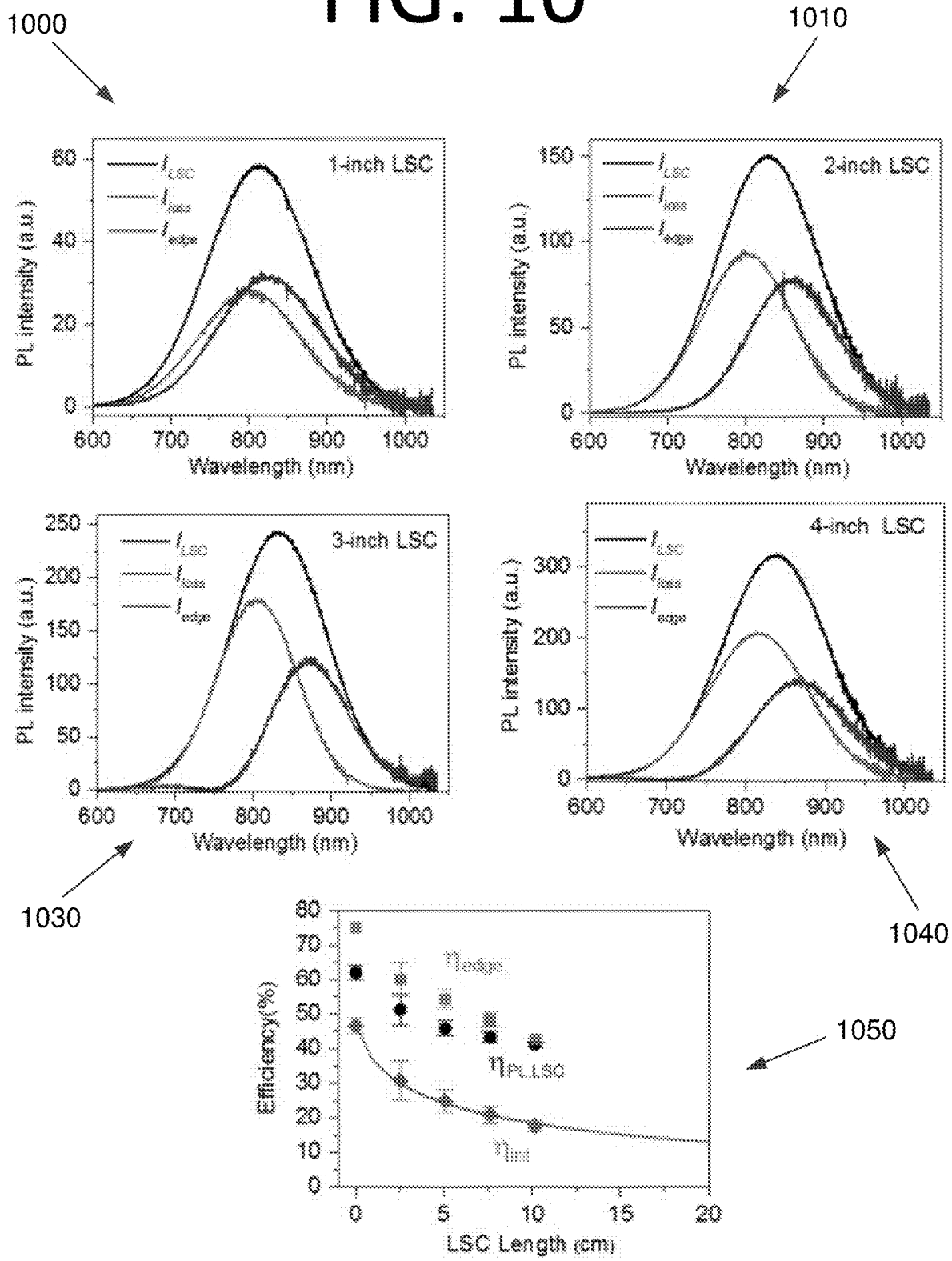
FIG. 10 illustrates graphs of optical measurements of CISe-QD LSCs using an integrating sphere top and middle graphs), as well as the PL QY of the LSC, the edge-emission efficiency of the LSC, and the internal quantum efficiency of the LSC plotted as a function of LSC length, according to an embodiment of the present invention.

FIG. 10 illustrates emission spectra of LSCs for four different device sizes: 1×1 in.$^2$ (1000); 2×2 in.$^2$ (1010); 3×3 in.$^2$ (1020); and 4×4 in.$^2$ (1030). The lines for the total LSC emission ($I_{LSC}$) and face-only emission ($I_{loss}$) were obtained by measuring the emission spectra of the unmasked LSC and the LSC with the edges masked with a black tape. The edge-emission spectrum ($I_{edge}$) is obtained by subtracting the above two spectra. FIG. 10 also illustrates the PL QY of the LSC ($\eta_{PL,LSC}$; circles), the edge-emission efficiency of the LSC ($\eta_{edge}$; squares), and the internal quantum efficiency of the LSC ($\eta_{int}$; diamonds) plotted as a function of LSC length. $\eta_{PL,LSC}$ is obtained by dividing $I_{LSC}$ by the absorbed flux of incident photons. $\eta_{edge}$ is obtained from $\eta_{edge}=I_{edge}/I_{LSC}\cdot\eta_{int}$ is calculated from $\eta_{int}=\eta_{PL,LSC}/\eta_{edge}$. The solid line is a fit using Eq. (4) below (see the associated discussion as well).

Figure 11:
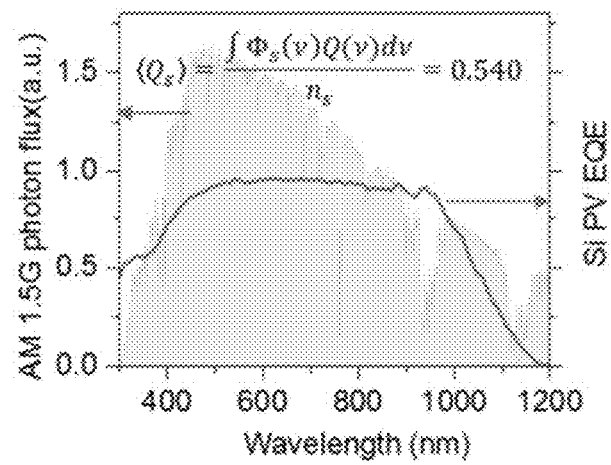
FIG. 11 illustrates graphs of Electro-optical measurements of CISe-QD LSCs, according to an embodiment of the present invention.
Figure 11:
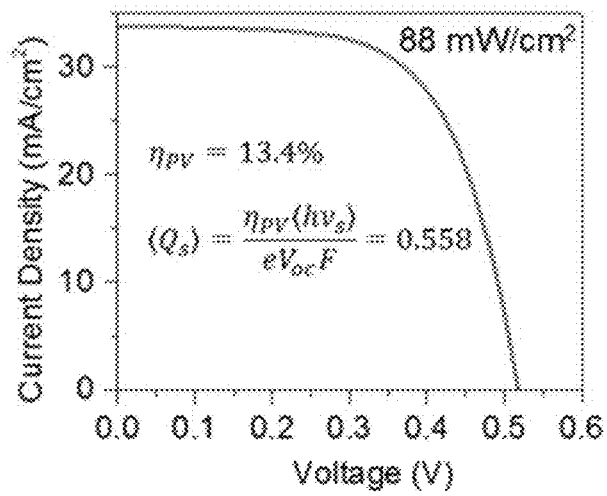
Figure 11:
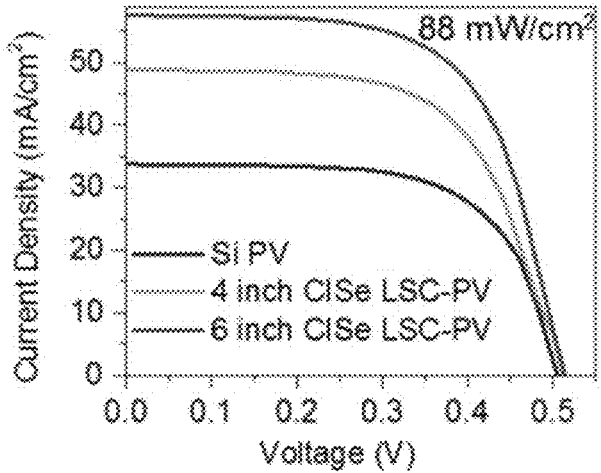

The second technique is more relevant to real life applications as it permits direct evaluation of the LSC efficiency in terms of the optical-to-electrical PCE, and importantly, allows for direct measurements under natural sunlight illumination. FIG. 11 illustrates graphs of Electro-optical measurements of CISe-QD LSCs, according to an embodiment of the present invention. Graph 1100 illustrates the EQE spectrum of the poly-crystalline PV cell used in the present study is averaged over the solar photon flux spectrum to yield the averaged EQE ($<Q_s>$) of 0.540. In comparison, the EQEs averaged over the PL spectra of the CISe/ZnS and Mn$^{2+}$-doped QDs used in the present study are 0.92 and 0.95, respectively. Graph 1110 illustrates that from the J-V measurement for the PV cell, the solar cell PCE ($\eta_{PV}$) is 13.4%. The averaged EQE ($<Q_s>$) calculated based on the measured short-circuit current is 0.558, which is in a good agreement with the value derived from the data in graph 1100.

In graph 1120, the J-V curves of the polycrystalline-silicon PV and two coupled LSC-PV devices measured under natural outdoor illumination with the sunlight power of 88 mW/cm$^2$. The PCEs of LSC-PVs are $\eta_{LSC-PV}$=0.90% for L=10.16 cm and $\eta_{LSC-PV}$=1.10% for L=15.24 cm. The short circuit currents of the LSC-PV systems with L=10.16 and 15.24 cm are, respectively, 1.44 and 1.71 times higher than $J_{SC}$ of the standalone PV. Using the results of these measurements in Eq. 7 below, $\eta_{int}$ of the investigated LSCs can be derived (see FIG. 12).

Figure 12:
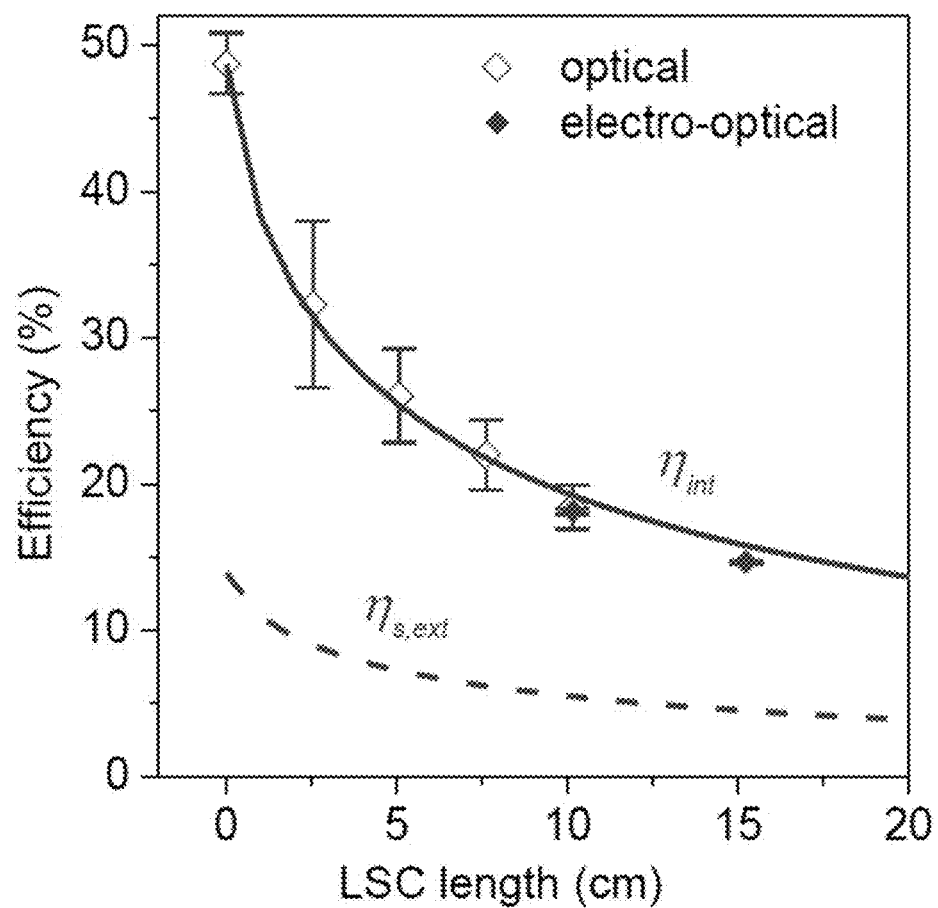
FIG. 12 is a graph illustrating the length-dependent $\eta_{int}$ measured by the integrating-sphere (open diamonds) and PV (solid diamonds) methods, according to an embodiment of the present invention.

Graph 1200 of FIG. 12 shows the length-dependent $\eta_{int}$ measured by the integrating-sphere and PV methods. More specifically, the integrating-sphere measurements of the LSC IQE are shown as a function of L from 0 to 10.16 cm (open diamonds) for devices having the same $\eta_{s,abs}$ (=28%) and $\eta_{PL}$ (=65%). The observed dependence can be accurately described assuming that propagation losses are dominated by reabsorption while losses due to scattering are negligibly small (solid line in FIG. 12). The performance of LSCs with L=10.16 and 15.24 cm has been also evaluated using electro-optical measurements (solid diamonds in FIG. 12). The obtained values are systematically lower than those from the optical measurements by ~8 relative percent due to imperfect (92% efficient) coupling of edge-emitted light into the PVs. The L-dependent values of $\eta_{s,ext}$ are obtained by multiplying $\eta_{int}$ by $\eta_{s,abs}$ (=28%): $\eta_{s,ext}=\eta_{int}\eta_{s,abs}$ (dashed line in FIG. 12). Notably, the performance of the devices of some embodiments is a considerable improvement over the best published results. For example, $\eta_{s,ext}$=5.1% measured here for the 12×12 cm LSC is ~40% higher than the highest literature value of 3.7% for the similarly sized CISeS-QD-based devices.

As was pointed out previously, in addition to demonstrating high external quantum efficiencies, CISeS-QD-based LSCs are particularly well-suited for applications as solar windows since they behave as neutral-density filters that do not introduce significant distortions to perceived colors. At the same time, they allow relatively easy control of the degree of shading by changing the concentration of the QDs (see the analysis of visible transmittance versus $\eta_{s,abs}$ in FIG. 8).

Top LSC Layer

It is now demonstrated that a further boost in $\eta_{s,ext}$ is possible by applying a tandem configuration, where the CISe/ZnS-QD LSC is supplemented by a top layer based on $Mn^{2+}$-doped $Cd_xZn_{1-x}S$ QDs, which increases $\eta_{int}$ for higher-energy solar photons. As was shown previously, $Mn^{2+}$-doped II-VI QDs allow for the realization of low-loss LSCs due to the fact that the d-d emission of the $Mn^{2+}$ ion occurs in a virtually reabsorption-free intra-gap region of a host semiconductor. See image and representation 1300 of FIG. 13. More specifically, a representative TEM image of $Mn^{2+}$-doped QDs is shown in the top left, and the $Mn^{2+}$-doped QDs are also schematically depicted in the bottom left. On the right, a schematic representation of electronic states and optical transitions responsible for light absorption and PL are shown. The emission due to the $^4T_1$-to-$^6A_1$ transition of the $Mn^{2+}$ ion is activated by the auger-type energy transfer (ET, wavy arrow) from the semiconductor host.

The most commonly studied $Mn^{2+}$-doped QDs are based on wide-band-gap ZnSe and ZnS. They, however, exhibit only moderate $\eta_{PL}$ of up to ~50%. A more recent class of $Mn^{2+}$-doped nanostructures are $Mn^{2+}:Cd_xZn_{1-x}S/ZnS$ core/shell QDs that can be fabricated using a scalable non-injection method. The use of an alloyed $Cd_xZn_{1-x}S$ core allows for a greater flexibility in controlling the absorption onset, and also helps mitigate lattice mismatch with the ZnS shell leading to a relatively high $\eta_{PL}$ of greater than 70%.

Figure 14:
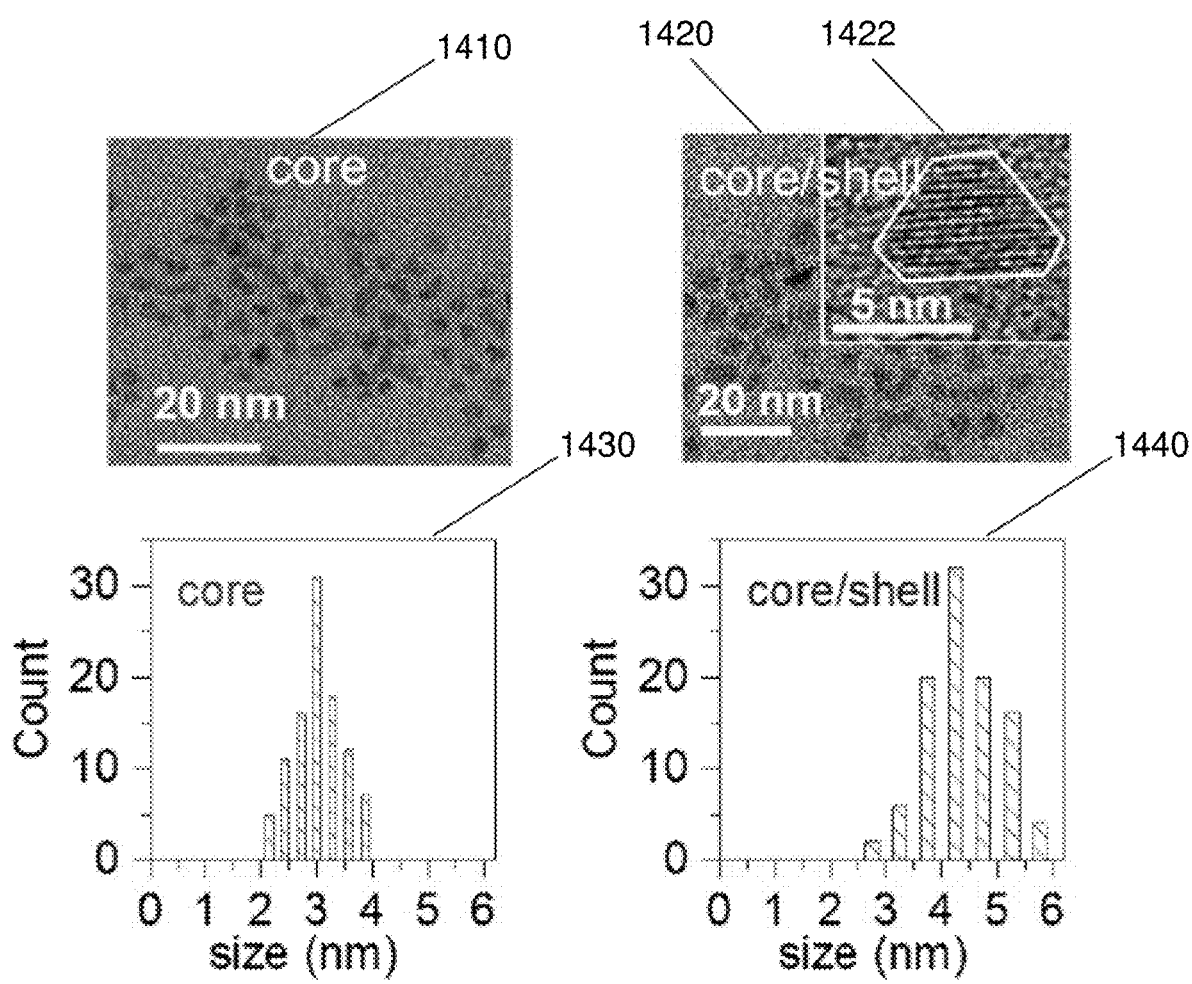
FIG. 14 illustrates TEM images and graphs for Mn$^{2+}$:Cd$_x$Zn$_{1-x}$S cores and Mn$^{2+}$:Cd$_x$Zn$_{1-x}$S/ZnS core/shell QDs, according to an embodiment of the present invention.

For the studies presented herein, $Mn^{2+}$-doped $Cd_xZn_{1-x}S$ (x=0.5) cores were synthesized with a 3.0±0.4 nm diameter, which were then overcoated with ~0.7-nm-thick shells. See FIG. 14, which illustrates TEM images and graphs 1400 for $Mn^{2+}:Cd_xZn_{1-x}S$ cores and $Mn^{2+}:Cd_xZn_{1-x}S/ZnS$ core/shell QDs, according to an embodiment of the present invention. TEM images were taken of the $Mn^{2+}:Cd_xZn_{1-x}S$ cores 1410 and $Mn^{2+}:Cd_xZn_{1-x}S/ZnS$ core/shell QDs 1420. Inset in image 1420 is a high-resolution TEM image 1422 of an individual core/shell particle. Histograms are also shown for the cores 1430 and the core/shell QDs 1440. The cores and core/shell QDs have average sizes of 3.0±0.4 nm and 4.4±0.6 nm, respectively.

Figure 15:
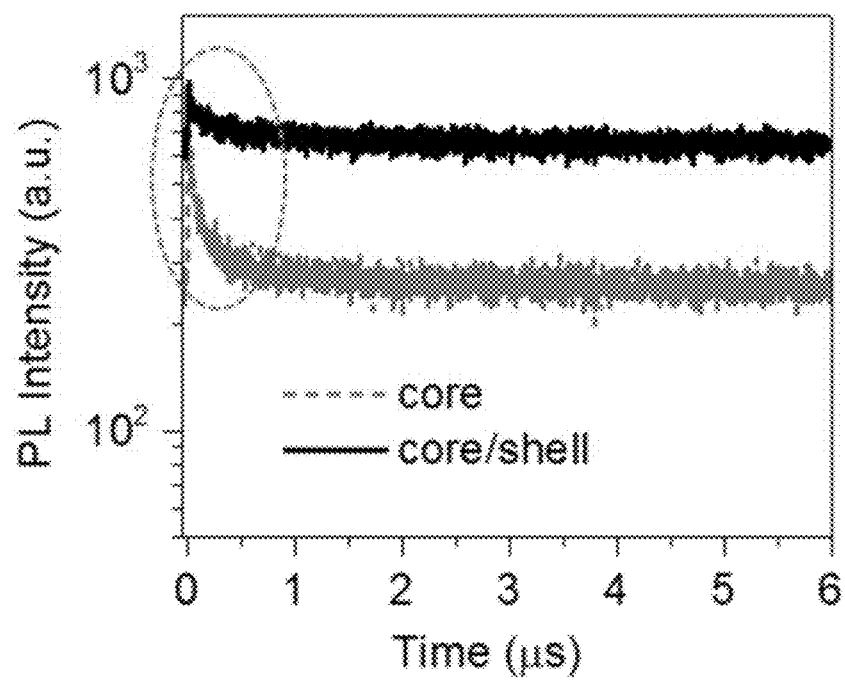
FIG. 15 is a graph illustrating the PL dynamics of Mn$^{2+}$:Cd$_x$Zn$_{1-x}$S cores and Mn$^{2+}$:Cd$_x$Zn$_{1-x}$S/ZnS core/shell QDs, according to an embodiment of the present invention.

The fabricated structures exhibit a relatively high $\eta_{PL}$ of 78±2% due to successful suppression of surface-related relaxation by the ZnS shell, as inferred from the measured PL dynamics. See graph 1500 of FIG. 15, where the excitation source is a 405 nm laser diode with the pulse width of ~1 ns; a nearly complete elimination of the fast PL decay component upon a shelling procedure indicates successful passivation of surface defects by the ZnS shell. As can be seen in FIG. 15, the PL peak is centered at ~600 nm, which is approximately 750 meV below the absorption onset at ~440 nm (see graph 500 of FIG. 5). Due to this relatively large spectral shift, the entire PL spectrum resides in the reabsorption-free region, a key to obtaining a high $\eta_{int}$.

Figure 13:
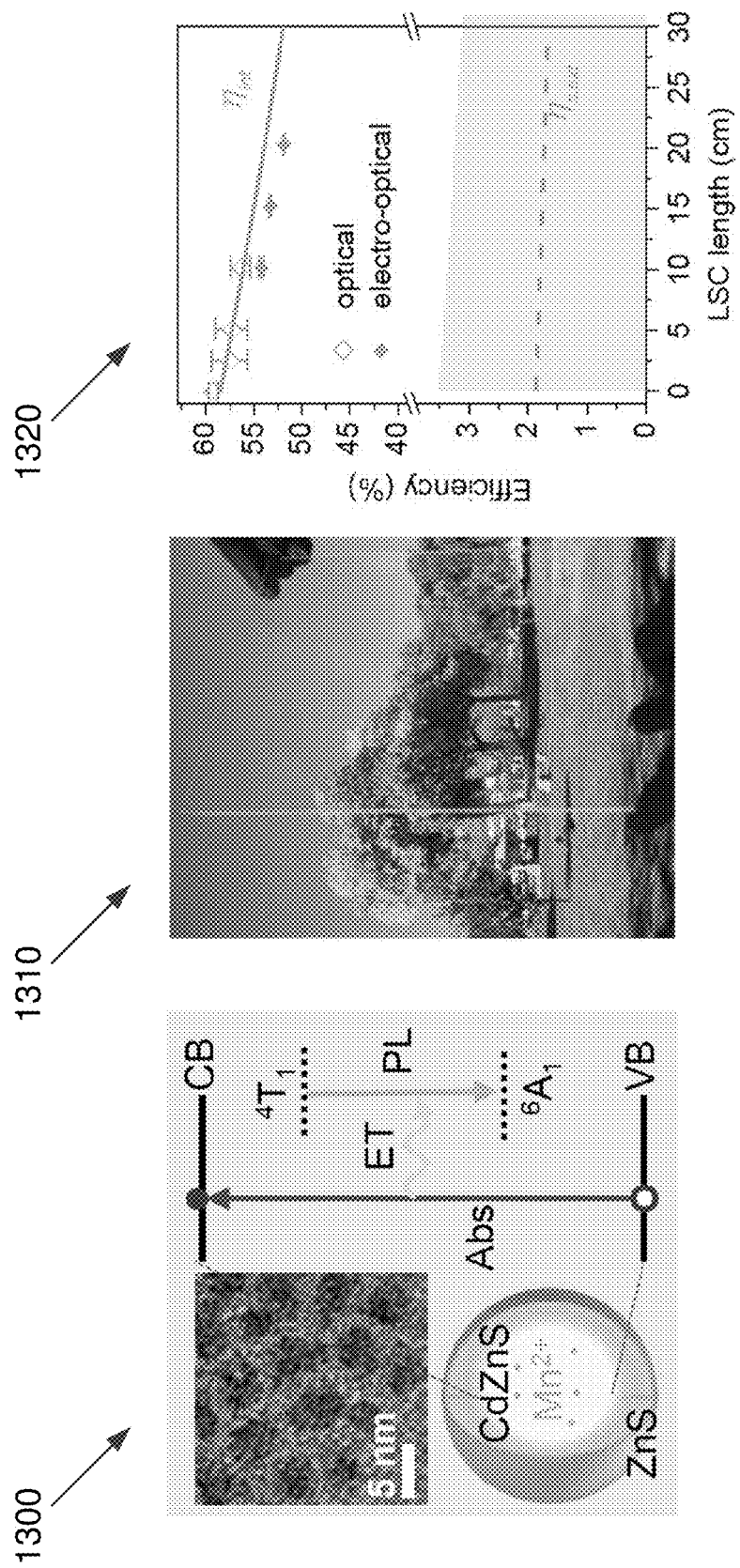
FIG. 13 illustrates a characterization of the top tandem-LSC layer based on Mn$^{2+}$-doped Cd$_x$Zn$_{1-x}$S/ZnS (CdZnS/ZnS) QDs, according to an embodiment of the present invention.

An example 1310 of a 20.32×20.32 cm (413 cm²) LSC fabricated using $Mn^{2+}$-doped QDs by the doctor-blade method is shown in FIG. 13. The device absorptance for incident sunlight is fairly small ($\eta_{s,abs}$=3.2%), which leads to its colorless appearance. See graphs 1600, 1610, 1620 of FIG. 16. As can be seen in graph 1600, an absorption spectrum of the LSC indicates sunlight absorptance ($\eta_{s,abs}$) of 3.2% and negligible scattering. Graph 1610 shows the spectrally integrated intensity of PL from the LSC edge as a function of distance (L) between the excitation spot and the collection edge (inset). Graph 1620 shows edge emission spectra as a function of L. The PL profile is almost L-independent, indicating virtually reabsorption-free propagation of reemitted light in the LSC waveguide. A weak spectrally uniform PL attenuation is due to weak scattering at optical imperfections within the LSC.

Graph 1320 of FIG. 13 shows $\eta_{int}$ for a series of LSCs of different dimensions (L=2.54 to 20.32 cm) obtained using both optical and electro-optical methods. Length-dependent $\eta_{int}$ is measured by optical (open diamonds) and PV (solid diamonds) methods. The solid line is modeling. The values of $\eta_{s,ext}$ (dashed line) are obtained by multiplying $\eta_{int}$ by $\eta_{s,abs}$ (=3.2%). Shading shows $\eta_{s,ext}$ achievable within the saturated value of $\eta_{s,abs}$ of 6%. Note a "break" in the vertical axis between ~4% and ~40%.

Figure 17:
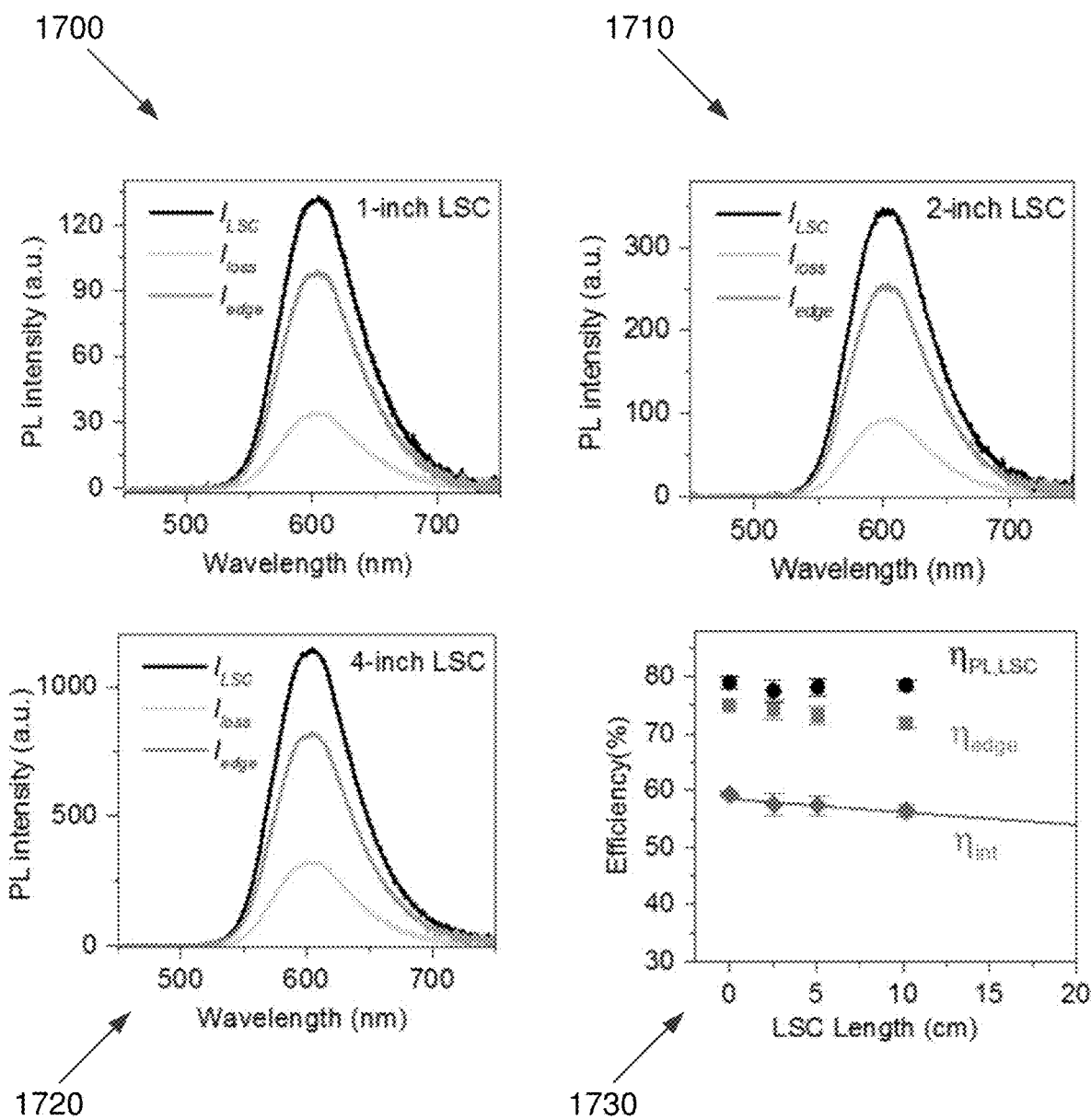
FIG. 17 illustrates graphs of optical measurements of Mn-doped QD-based LSCs using an integrating-sphere, according to an embodiment of the present invention.

FIG. 17 illustrates graphs of optical measurements of Mn-doped QD-based LSCs using an integrating-sphere, according to an embodiment of the present invention. Graphs 1700, 1710, 1720 show the same type of measurements and same notations as in graphs 1000, 1010, 1020, and 1030 of FIG. 10 for LSCs of three different sizes: 1×1 inch (1700), 2×2 inches (1710), and 4×4 inches (1720). Graph 1730 is similar to graph 1040 of FIG. 10, but for Mn-doped QD LSCs. Due to the "reabsorption-free" light propagation regime in LSCs based on Mn-doped QD, the drop in $\eta_{int}$ with increasing L is almost exclusively due to scattering. Based on the conducted measurements, the scattering coefficient $s_2$=0.012 cm$^{-1}$.

Figure 18:
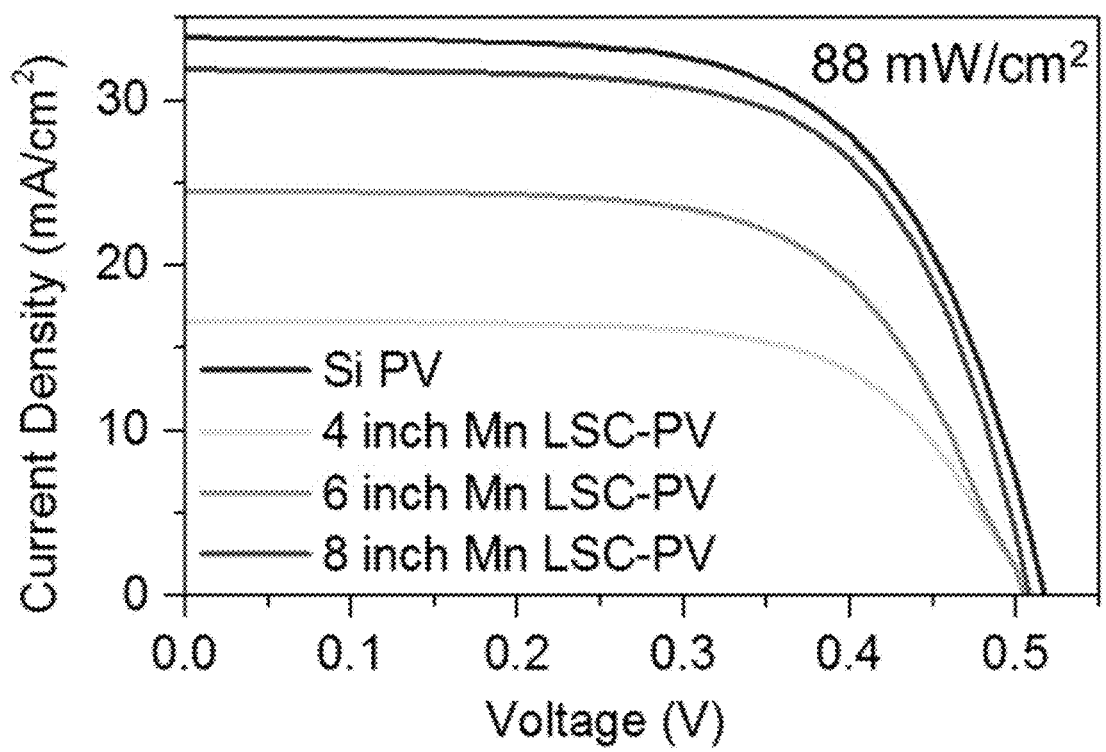
FIG. 18 is a graph illustrating electro-optical measurements of Mn-doped QD-based LSCs, according to an embodiment of the present invention.

FIG. 18 is a graph 1800 illustrating electro-optical measurements of Mn-doped QD-based LSCs, according to an embodiment of the present invention. The J-V characteristics of a polycrystalline-silicon PV and three coupled LSC-PV devices are measured under natural outdoor illumination with the sunlight power of 88 mW/cm². The PCEs of the LSC-PV systems are $\eta_{LSC-PV}$=0.39% for L=10.16 cm, $\eta_{LSC-PV}$=0.37% for L=15.24 cm, and $\eta_{LSC-PV}$=0.38% for L=20.32 cm. The short circuit currents of the LSC-PV systems with L=10.16 cm, 15.24 cm, and 20.32 cm are, respectively, 0.49, 0.72, and 0.94 times that of the stand-alone PV. Using the results of these measurements in Eq. (7), $\eta_{int}$ of the investigated LSCs can be derived (See graph 1320 of FIG. 13).

Figure 16:
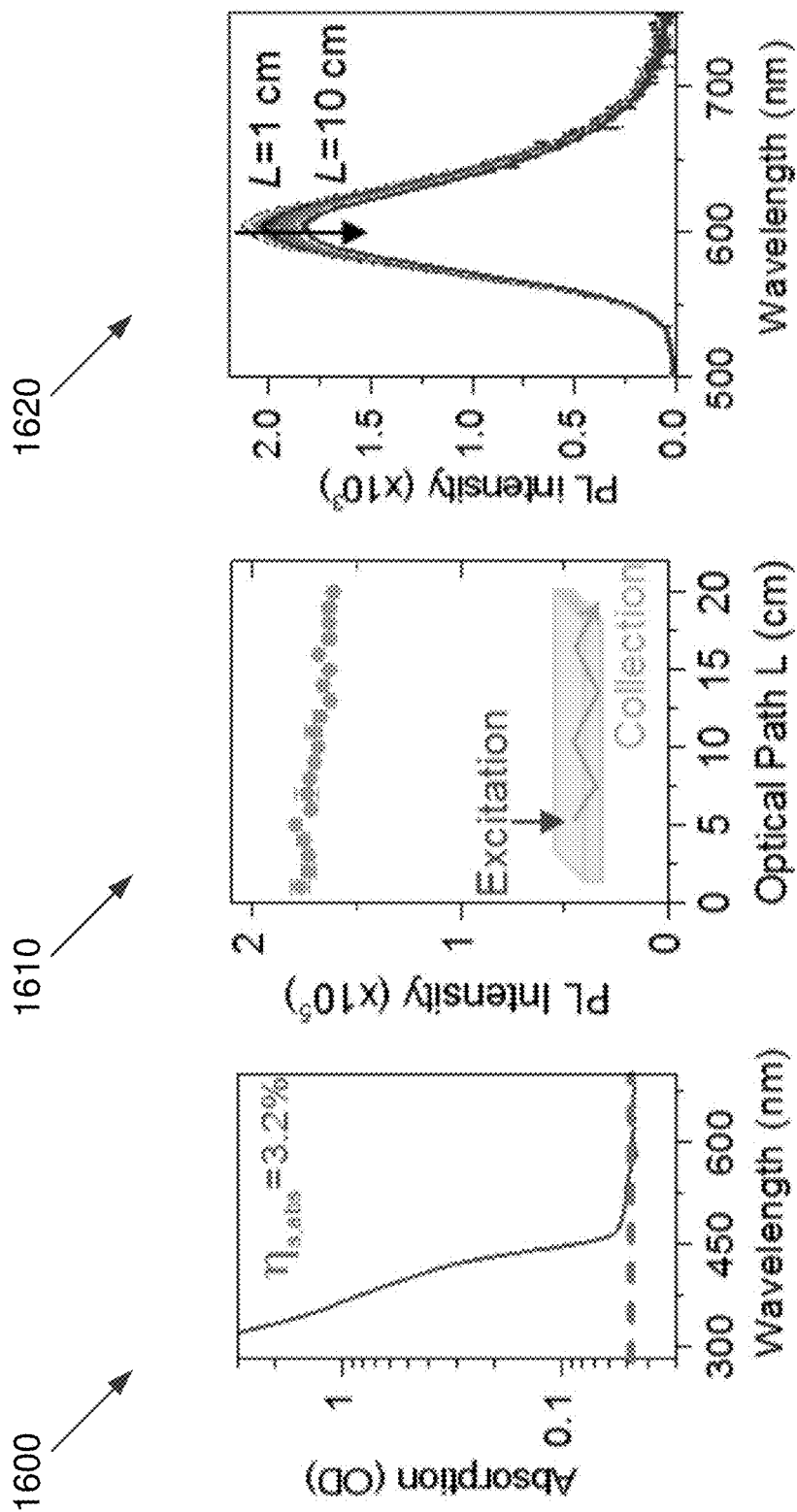
FIG. 16 illustrates graphs of measurements of PL propagation losses in Mn-QD LSCs, according to an embodiment of the present invention.

The measured $\eta_{int}$ shows only a small decline with increasing L (symbols in graph 1320 of FIG. 13), which occurs without distortion in the PL spectrum (see FIG. 16). This indicates that the observed PL loss is not due to reabsorption as in the case of CISe QDs, but rather weak spectrally independent scattering in the LSC waveguide, which can be modeled using the scattering coefficient of 0.012 cm$^{-1}$ (solid line in graph 1320). Interestingly, the obtained values of $\eta_{int}$ (greater than 50% even for large, 30-cm device lengths) are close to the reabsorption-free and scattering-free limit defined by the product of the light-trapping coefficient for the glass waveguide ($\eta_{trap}$ of ~75%) and $\eta_{PL}$, which yields ~58%.

Figure 19:
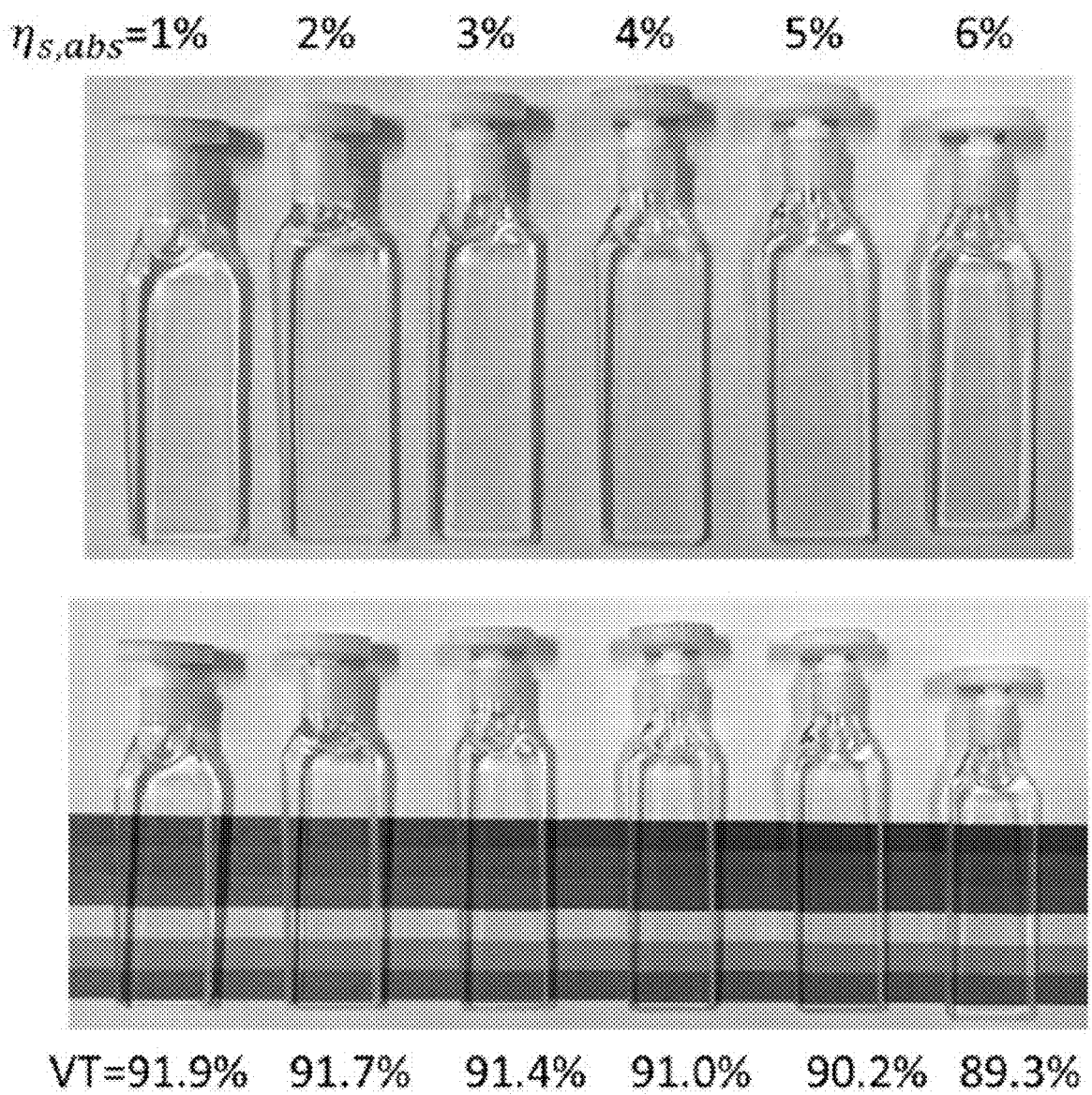
FIG. 19 is an image 1900 illustrating Mn$^{2+}$:Cd$_x$Zn$_{1-x}$S/ZnS core/shell QDs with varied concentrations, according to an embodiment of the present invention.

Due to their low absorptance, the external quantum efficiencies of the $Mn^{2+}$-doped-QD devices of some embodiments are in the sub-2% range (dashed line in graph 1320 of FIG. 13). However, by increasing the QD concentration in the polymer matrix solar absorptances ($\eta_{s,abs}$) can be pushed to ~6%. FIG. 19 is an image 1900 illustrating $Mn^{2+}:Cd_xZn_{1-x}S/ZnS$ core/shell QDs with varied concentrations, according to an embodiment of the present invention. Solar absorptances and visible transmittances (VT; calculated using Eq. (8)) of these samples are indicated in FIG. 19. For the 12 cm device, this would result in $\eta_{s,ext}$=3.4%, which approaches the previously reported value of 3.7% achieved with NIR CISeS QDs.

Due to their moderate performance when evaluated in terms of $\eta_{s,ext}$, $Mn^{2+}$-doped-QD LSCs have been primarily considered as model devices well suited for fundamental studies of luminescent concentration in the ideal, reabsorption-free regime, but not for real-life applications. Contrary to this common perception, in the next section, it is demonstrated that $Mn^{2+}$-doped QDs can enable highly efficient tandem devices when they are combined with CISe-based QDs. While the latter structures exhibit much stronger overall absorptivity across the solar spectrum, they suffer from incomplete elimination of reabsorption due to still existing overlap between absorption and emission spectra. By splitting off the higher-energy portion of the solar spectrum with the top layer made of $Mn^{2+}$-doped II-VI QDs, it is possible to partially mitigate this problem and increase the overall device efficiency.

Intermediate LSC Layers

As noted above, some embodiments have three or more layers (see, e.g., FIG. 2). Each intermediate LSC layer absorbs a portion of the solar spectrum not absorbed by layers above it. This configuration may allow more power to be harnessed from solar energy.

Tandem LSC Design and Characterization

Figure 20:
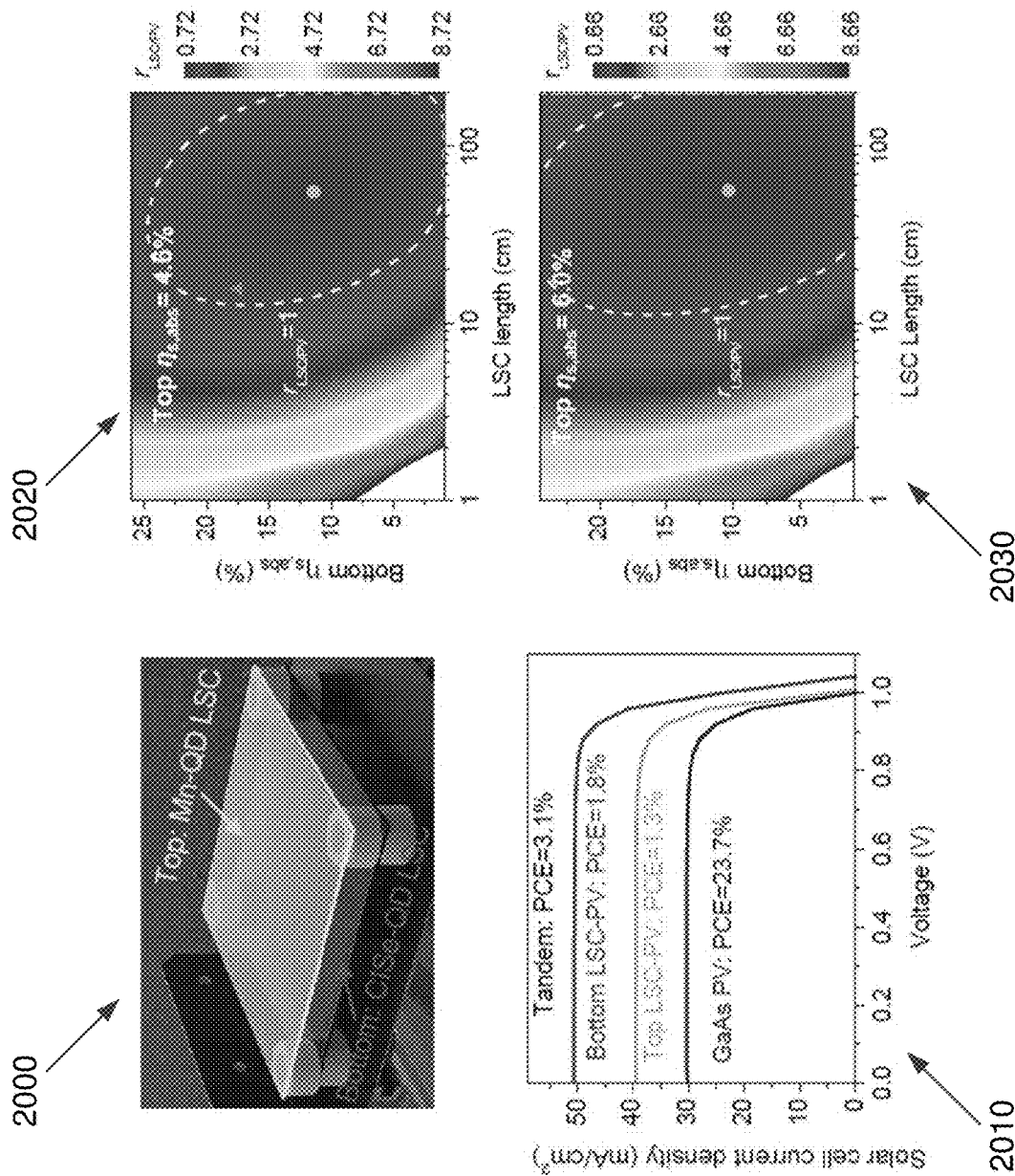
FIG. 20 illustrates an image and characterizations of a tandem LSC made of the Mn$^{2+}$-QD top layer and the CISe-QD bottom layer, according to an embodiment of the present invention.

A 15.24×15.24 cm (232 cm²) prototype tandem LSC based on $Mn^{2+}$-doped QDs (top layer, $\eta_{PL}$=78%, $\eta_{s,abs}$=4.6%) and CISe QDs (bottom layer, $\eta_{PL}$=72%, $\eta_{s,abs}$=24%) with an approximately 2 cm air gap is displayed in image 2000 of FIG. 20. Due to the spectral filtering by the top layer, $\eta_{s,abs}$ of the CISe-QD LSC is reduced from 24% to 17.3%. The absorption onset of the CISe QDs is slightly blue-shifted from that of the sample discussed earlier for obtaining a better spectral matching to GaAs solar cells used in the complete LSC-PV devices.

Figure 21:
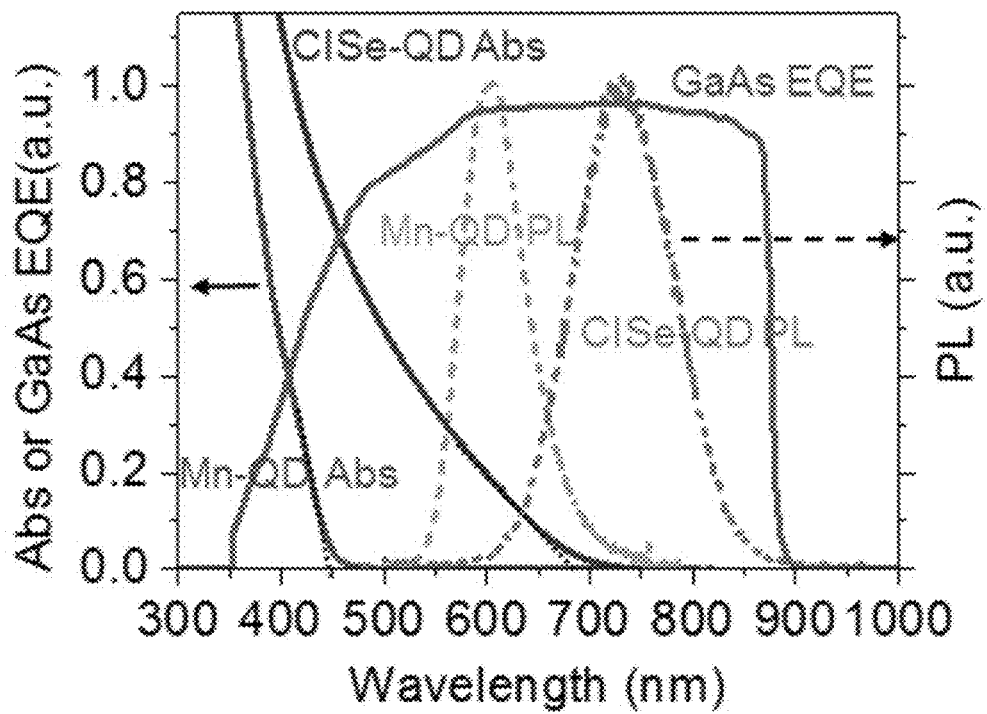
FIG. 21 is a graph illustrating optical spectra of QDs and an EQE of GaAs solar cells used in the tandem device of FIG. 20, according to an embodiment of the present invention.

FIG. 21 is a graph 2100 illustrating optical spectra of QDs and an EQE of GaAs solar cells used in the tandem device of FIG. 20, according to an embodiment of the present invention. The absorption and PL (QY=78%) spectra of the $Mn^{2+}$-doped $Cd_xZn_{1-x}S/ZnS$ core/shell QDs are exactly the same as those used in the single-layer LSC studies (See FIG. 13). The $CuInSe_2$/ZnS core/shell QDs used in the tandem are slightly different from those used in the single-layer device shown in graph 510 of FIG. 5. More specifically, both the onset of strong absorption and the PL band for these dots are blue-shifted to, respectively, 680 nm and 750 nm. The PL QY is 72%. The EQE spectrum line of the GaAs PV cells used in the LSC tandem devices is also shown. The EQE averaged over the solar photon flux spectrum ($<Q_s>$) is 0.401. In comparison, the EQEs averaged over the PL spectra of the CISe/ZnS and $Mn^{2+}$-doped QDs used in the tandem are 0.852 and 0.946, respectively. The latter values correspond to the "spectral re-shaping" factors (q) of 2.12 (CISe-based QDs) and 2.36 ($Mn^{2+}$-doped QDs).

Returning to FIG. 20, if the top and the bottom layers are used separately, their external quantum efficiencies are 2.6% and 5.3%, respectively. In the stacked, tandem configuration, $\eta_{s,ext}$ increases to 6.4% which is approximately a 21% improvement over the single-layer CISe-QD-based device. To evaluate the tandem LSC performance in a real-life device setting, measurements of solar-to-electrical PCE were conducted using edge-coupled high-efficiency GaAs solar cells. As shown in graph 2010 of FIG. 20, the current-density versus voltage characteristics of a standalone GaAs PV and the same type of PVs attached to either the top or the bottom LSC layer. Natural outdoor illumination was provided with an incident power of 104 mW/cm².

For the coupled LSC-PV system, the current density is calculated from the area of the edge-coupled PVs, while the PCE is obtained based on the solar flux incident onto the LSC. Therefore, while the LSC-PV system can show a higher current density than the standalone PV due to the effect of concentration, it can still exhibit a lower PCE. This situation is realized with the devices of Some embodiments.

According to graph 2010 of FIG. 20, the PCE of a standalone PV ($\eta_{PV}$) is 23.7%. The PCE of the coupled LSC-PV system ($\eta_{LSC-PV}$) can be related to $\eta_{PV}$ by $\eta_{LSC-PV}$=q$\eta_{s,ext}\eta_{PV}$=qhs,exthPV 225, where q is the spectral reshaping factor calculated as the ratio of the solar cell external quantum efficiency averaged over the PL spectrum of the LSC fluorophore and then averaged over the solar spectrum. Based on the optical performance of the tandem LSC of some embodiments and using q=2.36 and 2.12 for the top and the bottom layer QDs, respectively (see FIG. 21), it can be calculated that the PCE of the tandem LSC-PV system should be ~3.4% for the standard AM 1.5G solar spectrum. According to the actual measurements, the top and the bottom layers deliver PCEs of 1.3% and 1.8%, respectively (see graph 2010 of FIG. 20). This corresponds to the total PCE of 3.1%, which matches the calculations exactly if the 92% LSC-to-PV coupling efficiency is accounted for, as discussed earlier. Based on these measurements, the tandem configuration allows for approximately a 27% PCE boost even with the same types of PVs used for both LSC layers.

Figure 22A:
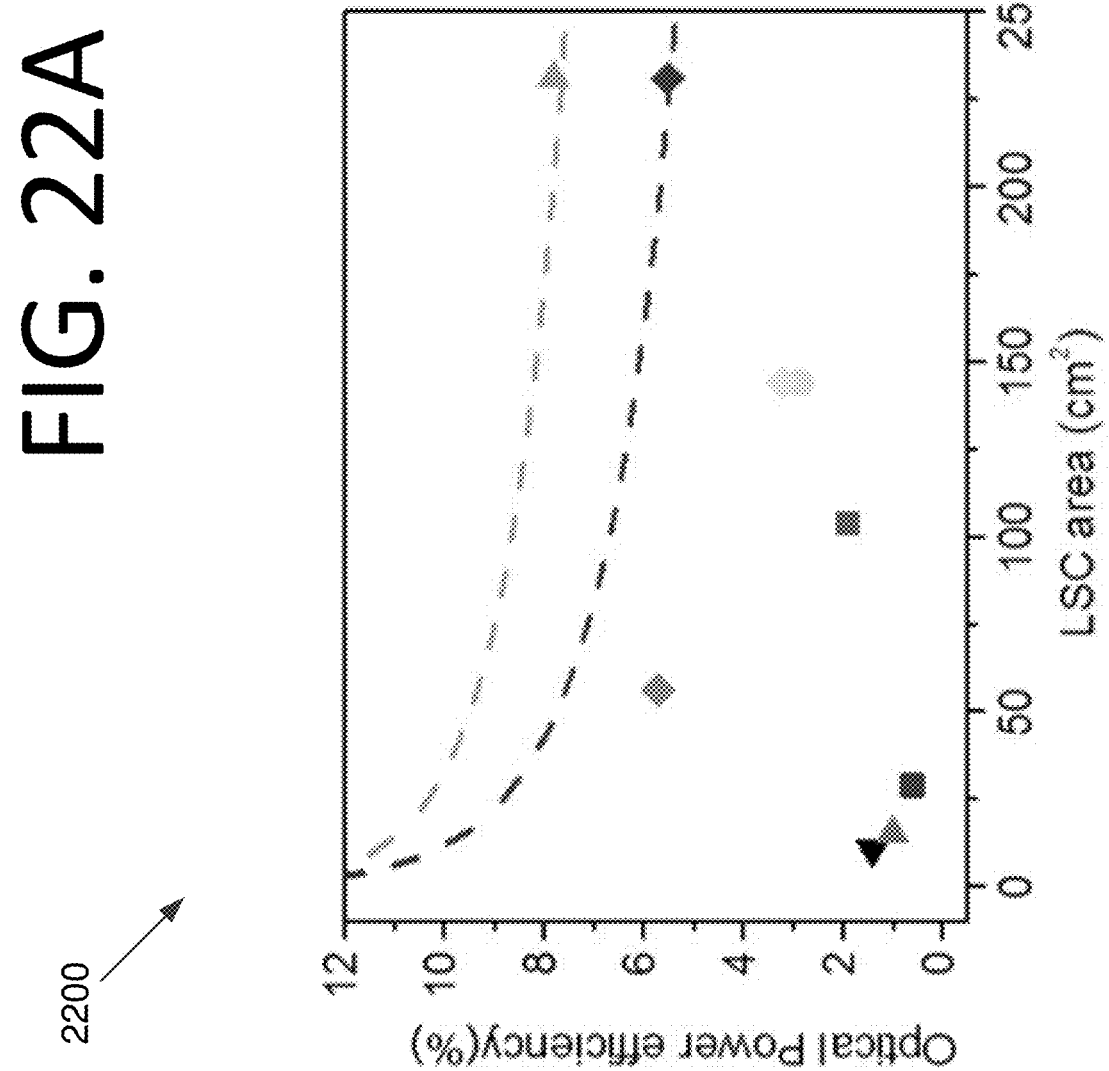
FIG. 22A is a graph plotting optical power efficiency as a function of LSC area of tested tandem LSCs versus conventional QD and dye molecule-based LSCs, according to an embodiment of the present invention.
Figure 22B:
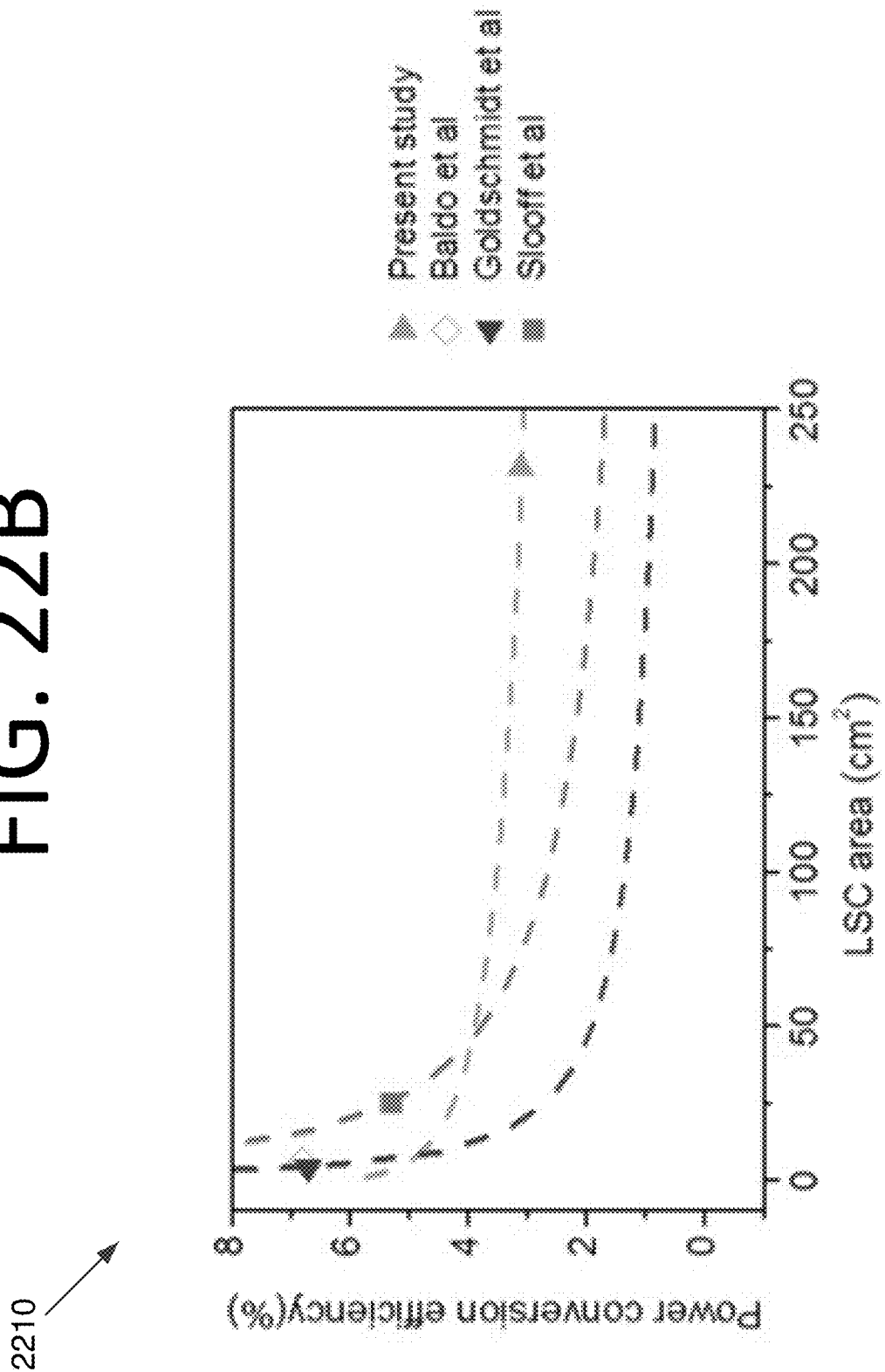
FIG. 22B is a graph plotting power conversion efficiency (PCE) as a function of LSC area of tested tandem LSCs versus conventional dye molecule-based LSCs, according to an embodiment of the present invention.

The performance of the tandem devices of some embodiments compares favorably to that of the best reported LSCs based on both QDs and dye molecules. FIGS. 22A and 22B provide comparisons of tested tandem LSCs to conventional QD and dye molecule-based LSCs. More specifically, graph 2200 of FIG. 22A plots optical power efficiency ($\eta_{s,p}$) as a function of LSC area of tested tandem LSCs versus conventional QD and dye molecule-based LSCs. The dashed lines are the extrapolated $\eta_{s,p}$ data obtained using the size-dependent LSC efficiencies reported in FIGS. 8 and 12. Both the single-layer CISe-QD LSCs and tandem devices of the tested embodiments are superior to QD-LSCs reported in the literature for all size regimes.

Graph 2210 of FIG. 22B plots power conversion efficiency (PCE) as a function of LSC area of tested tandem LSCs versus conventional dye molecule-based LSCs. The value for Baldo et al. shown with an open diamond symbol is not a directly-measured result, but rather, an estimation based on single-wavelength, point-by-point excitation measurements. Other data points (solid symbols) are obtained from direct measurements. The dashed lines are the extrapolated efficiency curves. Goldschmidt et al. and Slooff et al., the extrapolation is based on the fact that the efficiency of a conventional LSC scales inversely with the LSC size (L) according to Eq. (2).

For the tested tandem devices, however, the use of a zero-reabsorption top layer slows the efficiency drop with increasing LSC size, especially at larger sizes ($L^2>50$ cm²). The extrapolation uses the size-dependent LSC efficiencies reported in FIGS. 8 and 12. Although PCEs of the tested tandem devices are slightly lower than the best literature values for dye-based LSCs for smaller areas (i.e., less than 50 cm$^2$), the QD tandems are expected to significantly outperform dye-based LSCs in the case of larger area devices.

Accelerated aging tests of fabricated tandem QD structures indicate good photostability of both top and bottom layers (upon proper encapsulation), which should allow for virtually degradation-free operation in standard outdoor conditions for ~9.4 and ~38 months for the CISe-QD and Mn$^{2+}$-doped-QD layers, respectively. This is shown in graphs 2300 and 2310 of FIGS. 23A and 23B.

Figure 23A:
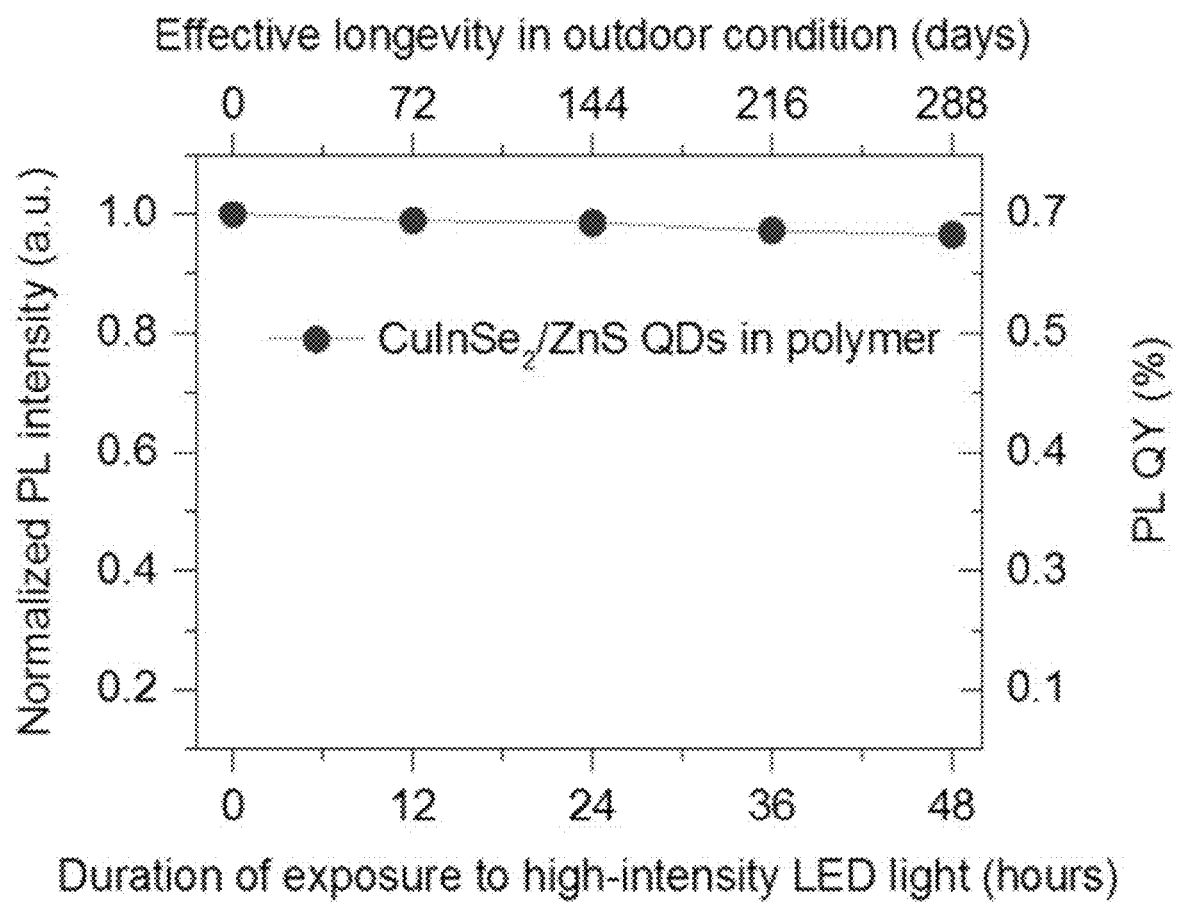
FIG. 23A is a graph 2300 illustrating results of an accelerated stability test on CISe QD/PVP composites, according to an embodiment of the present invention.

More specifically, FIG. 23A is a graph 2300 illustrating results of an accelerated stability test on CISe QD/PVP composites, according to an embodiment of the present invention. The film was fabricated by drop-casting the QD/PVP composite onto a coverslip and then loaded into a customized airtight cuvette under an N$_2$ atmosphere in a glove box. The excitation source was a 462 nm light-emitting diode (LED) with an intensity of 1.57 W/cm$^2$, which corresponded to an acceleration factor of 56.

Figure 23B:
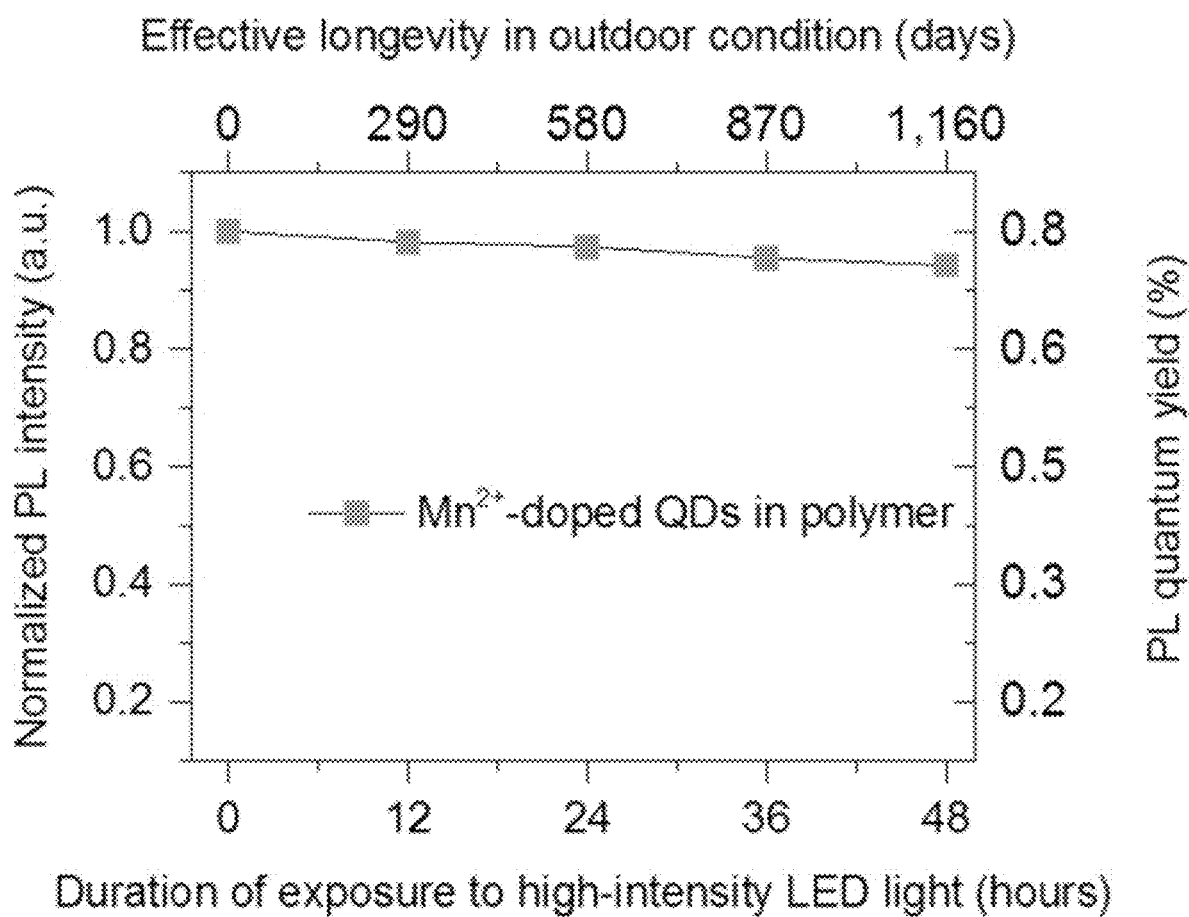
FIG. 23B is a graph illustrating an accelerated stability test on Mn$^{2+}$-doped QD/PVP composites, according to an embodiment of the present invention.

FIG. 23B is a graph 2310 illustrating an accelerated stability test on Mn$^{2+}$-doped QD/PVP composites, according to an embodiment of the present invention. The film was fabricated by drop-casting the QD/PVP composite onto a coverslip and then loaded into a customized airtight cuvette under an N$_2$ atmosphere in a glove box. The excitation source was a 405 nm LED with an intensity of 0.75 W/cm$^2$, which corresponded to an acceleration factor of 230.

In order to take a full advantage of the tandem geometry, each LSC layer should be coupled to a band-gap-matched PV. In the case of the tested tandem LSC, the top Mn$^{2+}$-doped QD-based LSC layer can, for example, be paired with GaInP PVs (~1.8 eV band gap). With $\eta_{PV}$=20.8%, the top layer would produce a PCE of 2.0% (assuming again the 8% coupling loss). Combined with the 1.8% PCE of the bottom layer, this will result in the total PCE of 3.8%, which represents a 55% improvement over the single-layer CISe-QD LSC. An even stronger relative enhancement is expected in larger-size devices as the beneficial effect of the top layer with a higher $\eta_{int}$ progressively increasing with increasing L (compare graph 1200 of FIG. 12 to graph 1320 of FIG. 13). For example, if the device size is expanded to 50 cm, the single-layer CISe-QD LSC coupled to GaAs PVs would deliver a PCE of 1.3%, while the tandem device would more than double this value (PCE of 2.9%) in the case of band-gap-matched PVs.

As discussed previously, one of the motivations for the development of the LSC-PV technology of some embodiments has been a potential reduction in the cost of solar electricity. To evaluate the cost-effectiveness of the developed QD LSC of an embodiment, a comparison of the per-W cost of solar electricity was performed between the standalone Si-PV and the coupled LSC-PV system, which was characterized in terms of the LSC cost-efficiency factor, $r_{LSC/PV}$. This is shown in more detail in FIG. 24, which shows the incident angle dependence of the short-circuit current of a standalone PV and a coupled LSC-PV device, according to an embodiment of the present invention.

Figure 24:
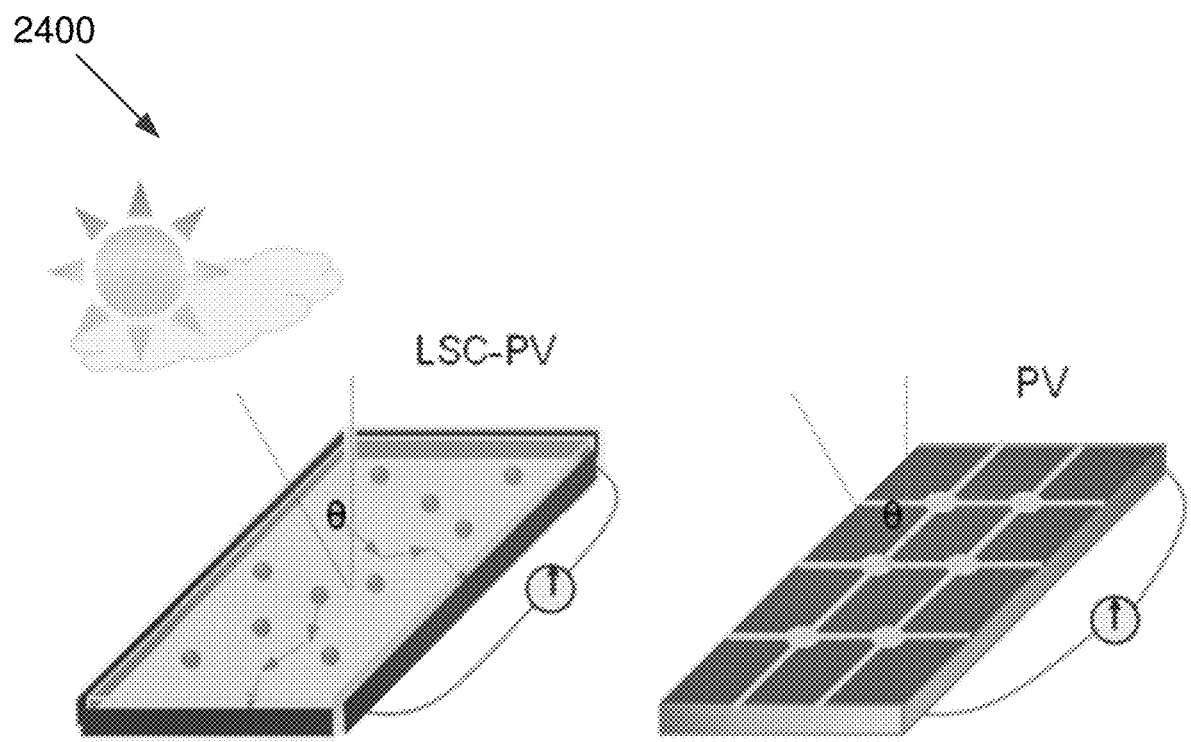
FIG. 24 illustrates the incident angle dependence of the short-circuit current of a standalone PV and a coupled LSC-PV device, according to an embodiment of the present invention.
Figure 24:
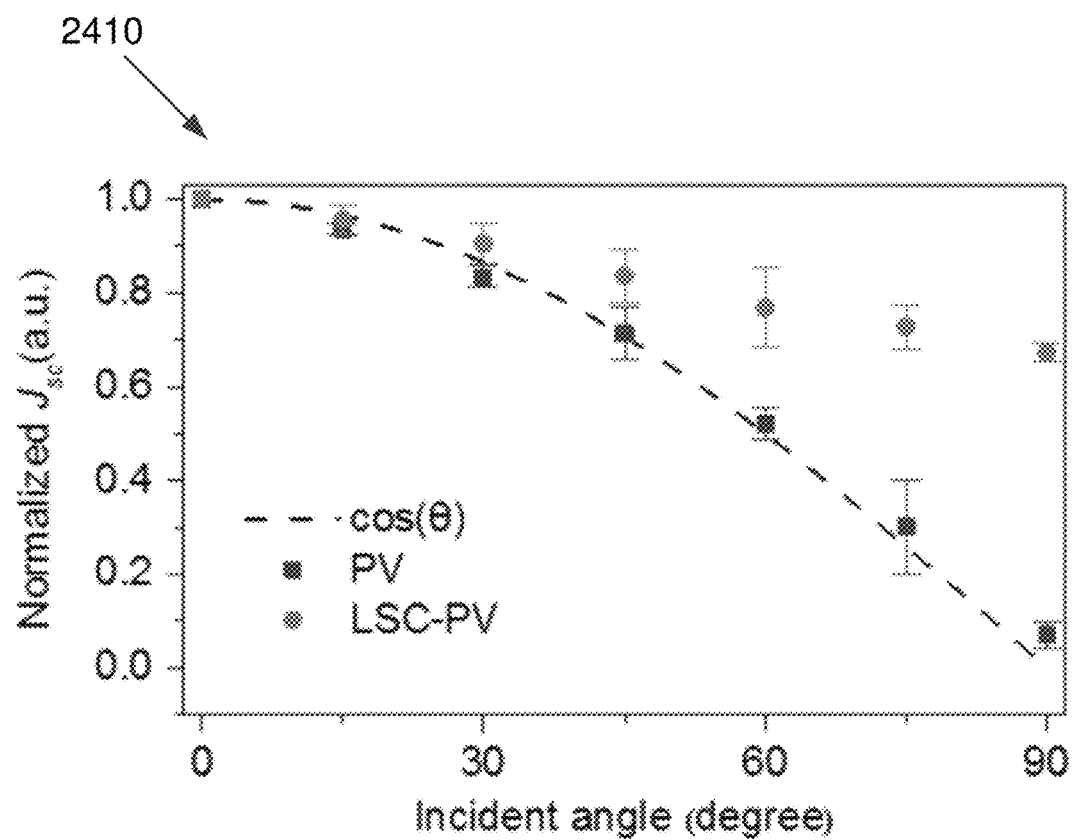

As can be seen in schematic representations 2400 of FIG. 24, a coupled LSC-PV device (left) and a standalone PV device (right) with the same effective light-harvesting area are shown. Graph 2410 shows the measured dependence of normalized short-circuit currents ($J_{sc}$) on the incident angle ($\theta$) of solar radiation for a PV cell (solid square) and the same cell coupled to a QD LSC (solid circle). The black dashed line is an ideal cos($\theta$) dependence. The $J_{sc}$ of an LSC-PV device maintains ~68% of its peak value when rotated to $\theta$=90°, while the $J_{sc}$ of the PV drops to ~6% of its peak value for the same angle.

Figure 25:
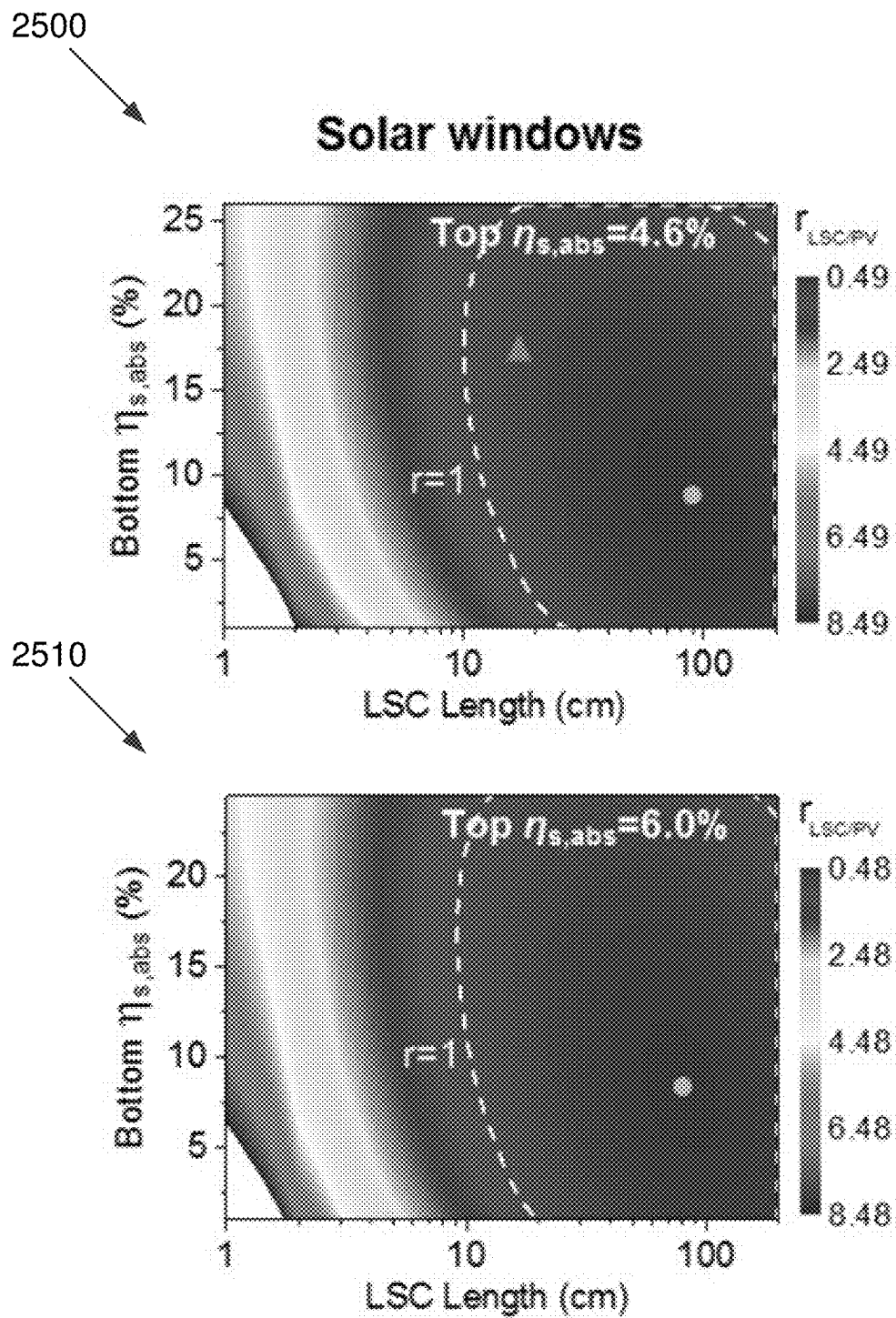
FIG. 25 includes graphs illustrating the LSC cost-efficiency factor ($r_{LSC/PV}$) for building integrated devices when the cost of glass is excluded from price estimations, according to an embodiment of the present invention.

Graphs 2500, 2510 of FIG. 25 illustrate the LSC cost-efficiency factor ($r_{LSC/PV}$) for building integrated devices when the cost of glass is excluded from price estimations, according to an embodiment of the present invention. Graph 2500 shows that the solar absorptance of the top layer is fixed at 4.6%, as in the tandem LSC discussed above. $r_{LSC/PV}$ is plotted as a function of the LSC size and the absorptance of the bottom layer. The dashed line corresponds to $r_{LSC/PV}$=1. This line circles the region where an LSC-PV device is more cost-effective than a standalone PV. The global minimum in this plot (circle) corresponds to $r_{LSC/PV}$=0.49, indicating a cost savings of 51%. The triangle represents the tandem LSC 2000 shown in FIG. 20, for which $r_{LSC/PV}$=0.77 (23% cost savings). Graph 2510 of FIG. 25 shows the same calculations performed for tandem LSCs with the absorptance of the top layer of 6.0%, which corresponds to the maximum value achievable with the tested Mn-doped QDs. The cost savings in this case is increased to 52%.

The cost-efficiency factor for the tested tandem LSC is 0.87 (triangle in graph 2020 of FIG. 20), indicating that the LSC-PV system utilizing the devices can in principle be more cost efficient (by ca. 13%) compared to existing Si PV-modules. By further optimizing LSC dimensions and $\eta_{s,abs}$ of the bottom layer, the cost savings can be increased to ~28% ($r_{LSC/PV}$=0.72; circle in graph 2020 of FIG. 20). If $\eta_{s,abs}$ of the top layer LSC is increased from 4.6% (used in current devices) to 6.0% (the maximum value achievable with the tested Mn$^{2+}$-doped QDs), the maximum attainable cost savings can be boosted to ~34% ($r_{LSC/PV}$=0.66; circle in graph 2030 of FIG. 20).

With respect to graphs 2020 and 2030 of FIG. 20, these show the LSC cost-efficiency factor ($r_{LSC/PV}$) versus the bottom-layer absorptance and the LSC length for the fixed absorptances of the top layer of 4.6% (graph 2020) and 6.0% (graph 2030). The yellow dashed line ($r_{LSC/PV}$=1) circles the region where an LSC-PV system is more cost efficient than a standalone PV. The triangle in graph 2020 corresponds to the tested tandem LSC ($r_{LSC/PV}$=0.87). The circles mark the global minima that correspond to $r_{LSC/PV}$=0.72 and 0.66 for $\eta_{s,abs}$=4.6% and 6.0% in graphs 2020 and 2030, respectively.

A large area, high performance tandem QD-LSC has bene demonstrated herein. It has been shown that even with a weakly absorbing top layer, it is possible to obtain an appreciable improvement in the LSC performance if the top layer IQE exceeds that of the strongly absorbing bottom layer. In the developed prototype 15.24×15.24 cm tandem LSCs, the PCE improvement versus single-layer devices can exceed 50% (with band-gap-matched PVs), and can be greater than 120% in window-size 50×50 cm devices. Due to the strong performance achievable with low cost, solution-processable materials, QD-based tandems and more complex multi-layered LSCs can provide a viable pathway to further reducing the cost of solar electricity by complementing the existing PV technology with high efficiency sunlight collectors deployable as standalone LSC-PV modules or semi-transparent building-integrated solar windows, for instance.

Further Improvements to LSC Tandems and Multi-Layer Devices

Recently, performance of LSC tandems has been enhanced by improving characteristics of the top and bottom layers. Improvements are also possible in devices with more than two layers.

Top Layer

Figure 26A:
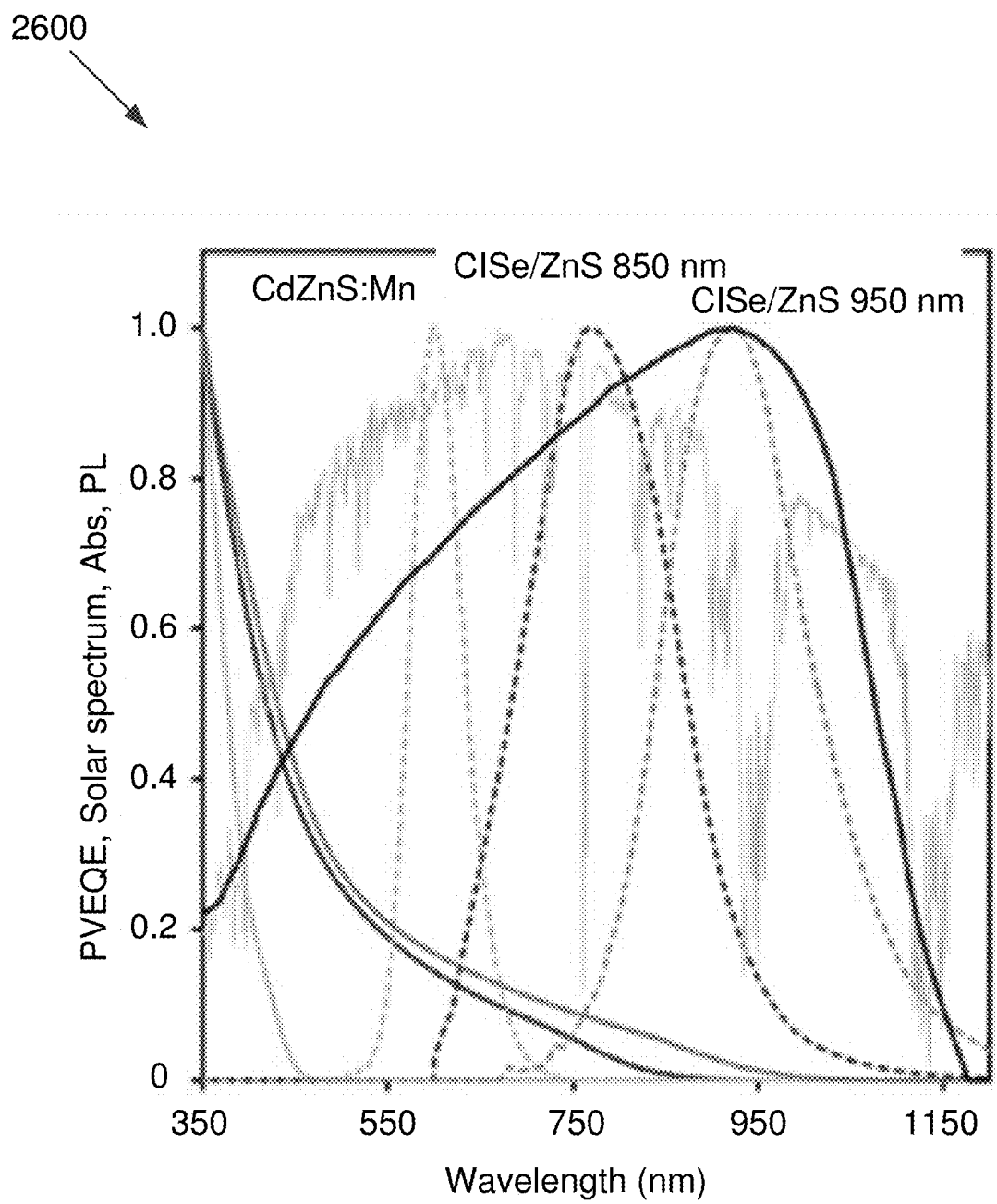
FIG. 26A is a graph 2600 illustrating absorption and photoluminescence (PL) spectra of the top-layer CdZnS:Mn QDs and the bottom-layer CISe/ZnS QDs, according to an embodiment of the present invention.

The PL quantum yield (QY) of Mn-doped CdZnS was improved from ~70% to more than 80%. The spectral characteristics of these dots (emission and absorption spectra) versus other dots are shown by dashed lines in graph 2600 of FIG. 26A. More specifically, graph 2600 shows absorption and photoluminescence (PL) spectra of the top-layer CdZnS:Mn QDs (light gray dashed line) and the bottom-layer CISe/ZnS QDs with the absorption onset at ~850 nm (black dashed line) and 950 nm (dark gray dashed line). The solar spectrum and the Si PV EQE are shown by solid gray and black lines, respectively.

Figure 26B:
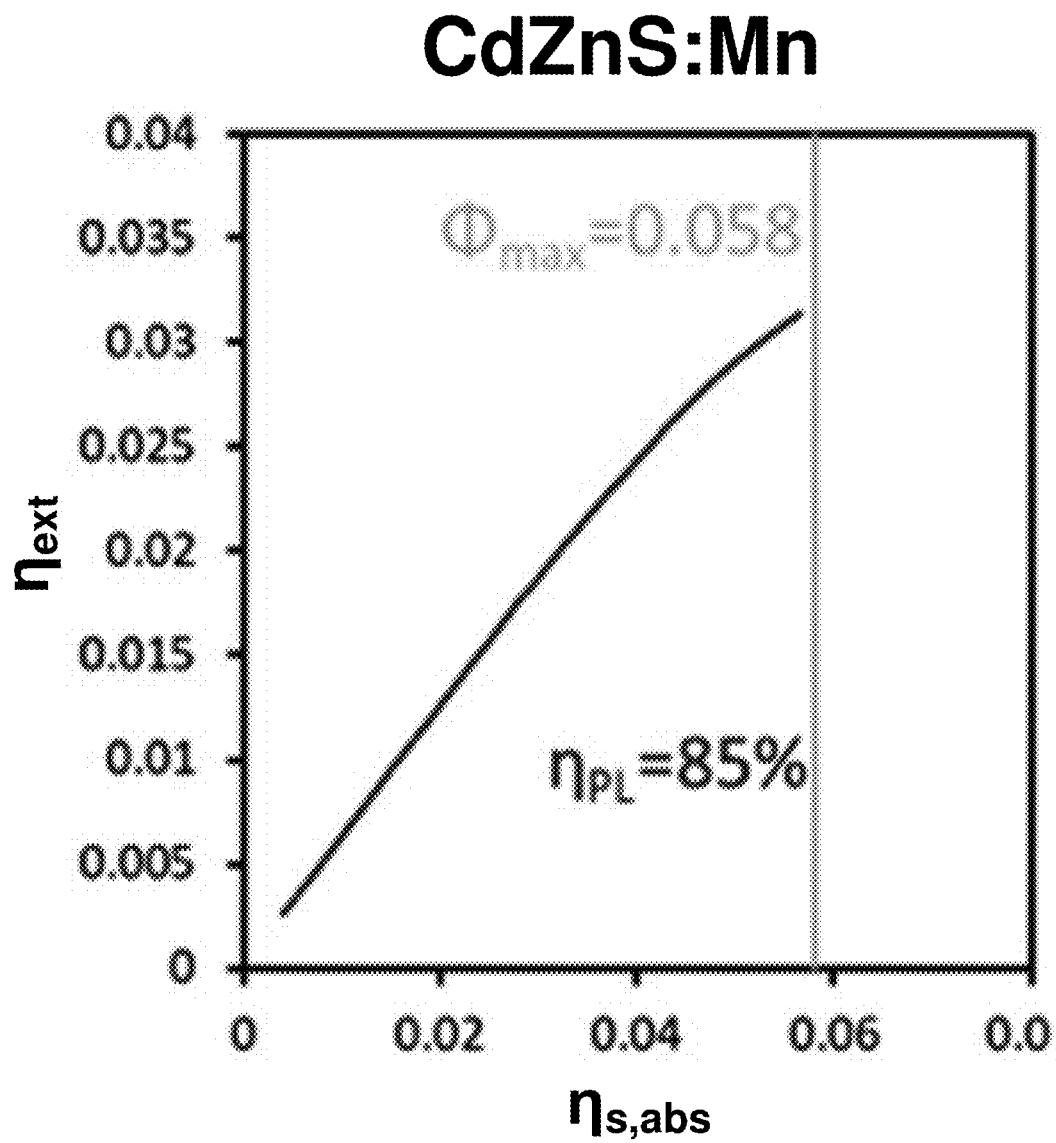
FIG. 26B is a graph illustrating the external optical quantum efficiency (next) versus solar absorptance ($\eta_{s,abs}$) for the top layer CdZnS:Mn LSC, according to an embodiment of the present invention.

The improved PL QY translated in the increased top layer EQE. In particular, for $\eta_{s,abs}$ of 6%, the EQE was boosted to ~3.2%, versus ~2% in graph 2610 of FIG. 26B. More specifically, graph 2610 shows the external optical quantum efficiency ($\eta_{ext}$) versus solar absorptance ($\eta_{s,abs}$) for the top layer CdZnS:Mn LSC.

Bottom Layer

The PL QY of the CuInSe$_2$/ZnS QDs used in the bottom layer has also been improved to 88% from ~70%. This has translated in the enhancement of the single-layer EQE to ~6% (see the solid line in graph 2620 of FIG. 26C). More specifically, graph 2610 shows the external optical quantum efficiency ($\eta_{ext}$) versus solar absorptance ($\eta_{s,abs}$) for the bottom-layer (solid) and tandem devices (dashed) for presently available (gray) PL quantum yields ($\eta_{PL}$).

Tandems

Figure 26C:
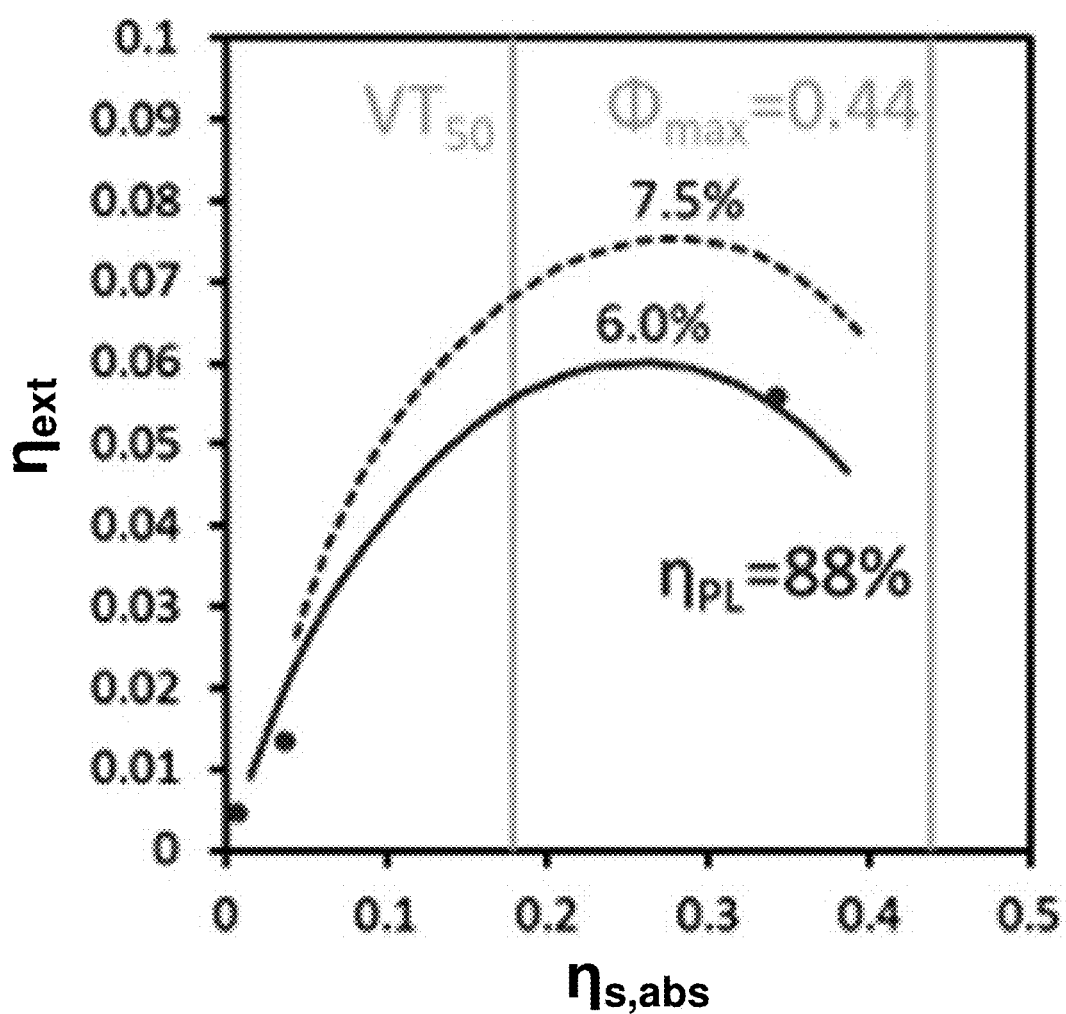
FIG. 26C is a graph illustrating the external optical quantum efficiency (next) versus solar absorptance ($\eta_{s,abs}$) for the bottom-layer (solid) and tandem devices (dashed) for presently available (gray) PL quantum yields ($\eta_{PL}$), according to an embodiment of the present invention.

Tandem LSCs including the refined QDs show an EQE of ~7.5% (dashed line in graph 2620 of FIG. 26C). This is a more than 15 relative percent improvement compared to previous devices.

Increasing Solar Absorptance of the Bottom Layer

Figure 26D:
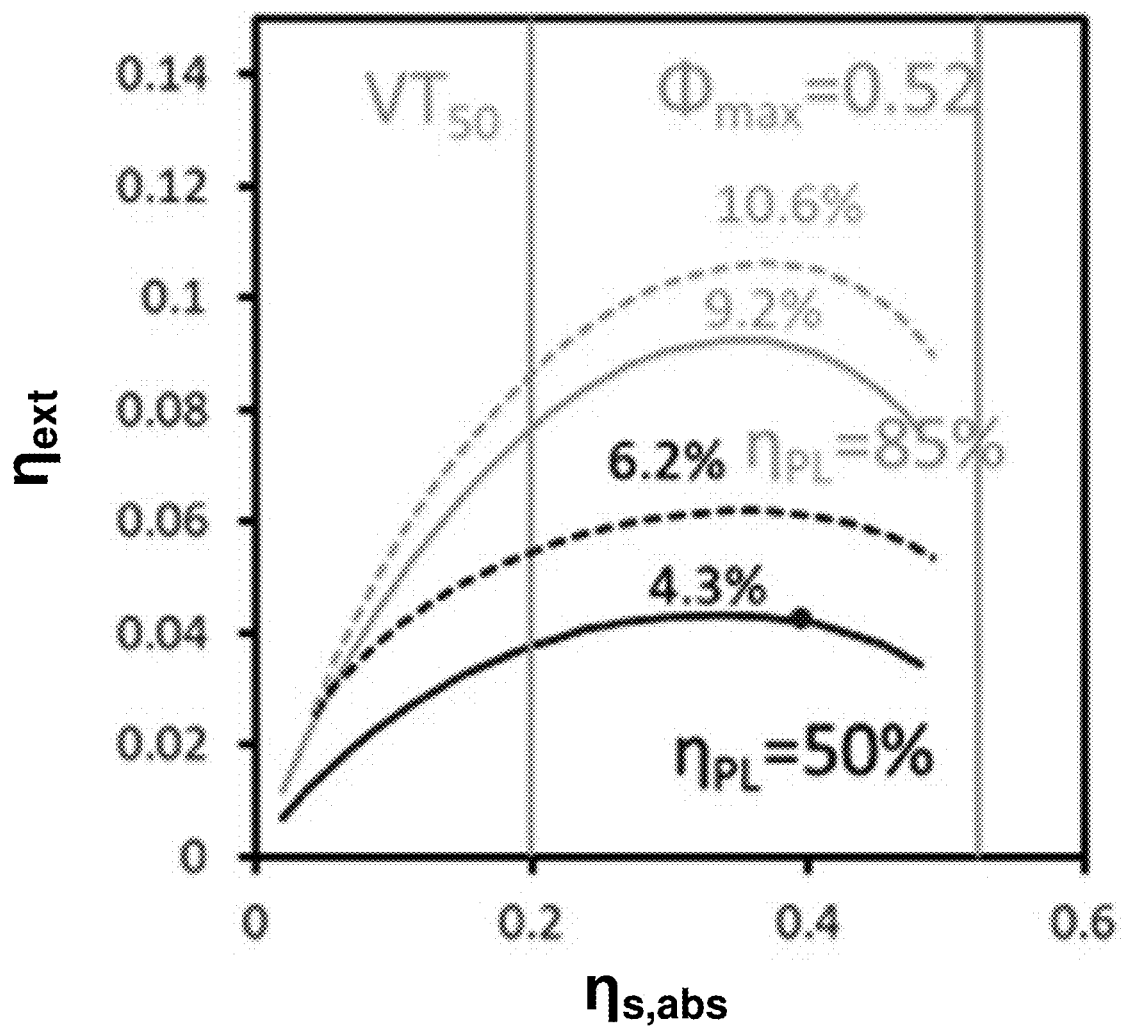
FIG. 26D is a graph illustrating the external optical quantum efficiency ($\eta_{ext}$) versus solar absorptance ($\eta_{s,abs}$)

The bottom-layer absorptance may be enhanced by increasing the size of the CuInSe$_2$ cores. This should lead to a decreased band gap and improved sunlight harvesting. An example of absorption and PL spectra of a new generation of NIR CuInSe$_2$/ZnS QDs is shown in the right dashed line of FIG. 26A. For these new dots, the absorption onset shifts to ~950 nm compared to ~850 nm. The PL peak also experiences a similar ~100 nm red shift. Presently, the PL QY of the new dots is ~50%, which is lower than those previously considered. However, due to increased solar absorptance, the LSC tandems made of these dots show comparable performance ($\eta_{ext}$=6.2%; dashed black line in graph 2630 of FIG. 26D) to that of prior QDs ($\eta_{ext}$=6.4%).

The effort to increase the PL QY of NIR-emitting CuInSe$_2$/ZnS QDs is in progress. It is projected that after achieving QY of 85%, EQEs of more than 10% can be demonstrated in tandem devices. See the dashed light gray line in graph 2630 of FIG. 26.

Modeling of Optical Quantum Efficiencies of Planar LSCs

The optical quantum efficiencies of planar LSCs, including scattering effects by introducing a scattering coefficient s$_2$ for light reemitted by LSC QDs, can be calculated. The internal quantum efficiency (IQE; $\eta_{int}$) or the collection efficiency $\eta_{col}$ is treated as the sum of the collection efficiencies for different-generation photons. This IQE is given by:

$$\eta_{int} = \eta_{col} = \frac{\eta_{PL}\eta_{trap}}{1 + \beta(\alpha_2 + s_2)L\left[1 - \left(\frac{\alpha_2\eta_{PL} + s_2}{\alpha_2 + s_2}\right)\eta_{trap}\right]} \quad (1)$$

where $\alpha_2$ is the absorption coefficient of the LSC fluorophores (i.e., QDs) at the emission wavelength, $\beta$ is a constant (~1.4), L is the LSC length, $\eta_{PL}$ is the photoluminescence (PL) quantum yield (QY) of QDs measured in dilute solutions, and $\eta_{trap}$ is the efficiency of the light trapping into waveguide modes (75% for a waveguide with the refractive index n=1.5). If scattering is ignored, Eq. (1) reduces to:

$$\eta_{int} = \eta_{col} = \frac{\eta_{PL}\eta_{trap}}{1 + \beta\alpha_2L(1 - \eta_{PL}\eta_{trap})} \quad (2)$$

In the case of zero reabsorption ($\alpha_2$=0), scattering becomes the efficiency-limiting factor. This situation is realized in MN$^{2+}$-doped QD LSCs, for example, where $$\eta_{int} = \eta_{col} = \frac{\eta_{PL}\eta_{trap}}{1 + \beta s_2 L(1 - \eta_{trap})} \quad (3)$$

Note that all previous derivations have been performed for single-wavelength absorption or scattering coefficients $\alpha_2$ or s$_2$, which is a good approximation when the PL is narrow. However, if the PL is broad, which is the case with broad absorption spectrum QDS (e.g., CuInSe$_2$), the collection efficiency can be obtained by spectrally averaging Eqs. (1)-(3) over the PL band $\Phi_{PL}(v)$ of the QDs. For instance, the averaged Eq. (2) becomes:

$$\eta_{int} = \frac{\int \eta_{PL}\eta_{trap}[1 + \beta\alpha(v)L(1 - \eta_{PL}\eta_{trap})]^{-1}\Phi_{PL}(v)dv}{\int \Phi_{PL}(v)dv} \quad (4)$$

Another point that should be noted is that for layered LSCs of some embodiments where a thin QD/polymer layer (thickness d) is deposited onto a much thicker glass substrate (thickness D), $\alpha_2$ is an effective absorption coefficient determined from:

$$\alpha_{2,eff} = \frac{\alpha_2 d}{D + d} \quad (5)$$

Derivation of Internal Quantum Efficiencies of LSCs from Electro-Optical Measurements A detailed derivation of the relationship between the power conversion efficiencies (PCEs) of a standalone PE cell $\eta_{PV}$ and a coupled LSC-PV system $\eta_{LSC-PV}$ has been done. According to these calculations:

$$\eta_{LSC-PV} = \frac{\langle Q_{PL} \rangle}{\langle Q_s \rangle}\eta_{s,abs}\eta_{int}\eta_{PV} = q\eta_{s,abs}\eta_{int}\eta_{PV} \quad (6)$$

where q is the "spectral reshaping" factor of the LSC defined as $\langle Q_{PL}\rangle/\langle Q_s\rangle$, and $\langle Q_s\rangle$ and $\langle Q_{PL}\rangle$ are the external quantum efficiencies Q of the PV device averaged over the solar spectrum and the LSC PL spectrum, respectively. The IQE $\eta_{int}$ of the LSC can be obtained by comparing the short circuit current densities J$_{sc}$ of the LSC-PV system and the standalone PV:

$$\eta_{int} = \frac{J_{sc,LSC-PV}}{q\eta_{s,abs}J_{sc}G} \quad (7)$$

Calculations of Visible Transmittance

Figure 8:
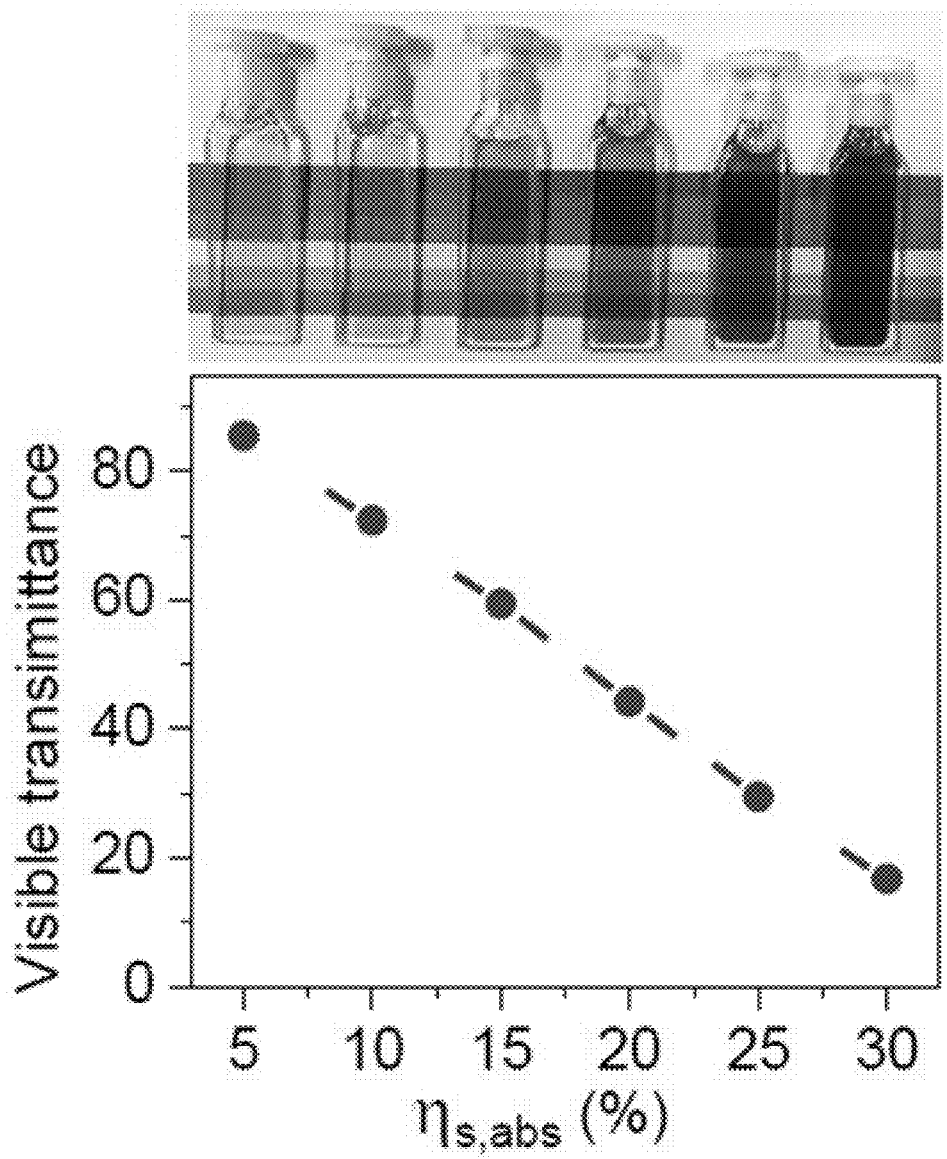
FIG. 8 is an image and a graph illustrating solution samples of CISe/ZnS QDs with different sunlight absorptances $\eta_{s,abs}$ from 5% to 30% (left to right) that correspond to visible transmittances from 85.5% to 16.8%, respectively, according to an embodiment of the present invention.

The weighted average visible transmittance (VT) of an LSC window can be calculated from:

$$VT = \frac{\int T(\lambda)P(\lambda)S(\lambda)d\lambda}{P(\lambda)S(\lambda)d\lambda} \quad (8)$$

Where $\lambda$ is the light wavelength, $T(\lambda)$ is the transmittance window, $P(\lambda)$ is the phototopic response function of a typical human eye, and $S(\lambda)$ is the solar spectrum. $T(\lambda)$ of a QD-LSC is given by $T(\lambda)=(1-R)10^{-OD(\lambda)}$, where R is the reflectance of a glass window and $OD(\lambda)$ is the optical density of the QD layer. For CISe-QD LSCs, the absorption of QDs in the visible range is strong so that only reflectance from the front glass surface is considered; hence, R≈4%. For Mn-QD LSCs, the QDs have very weak absorption in the visible range so that the reflectances from both the front and back glass surfaces have to be considered. Hence, R≈4%. Using $OD(\lambda)$ spectra of QD samples, VT is calculated for CISe-QD and $Mn^{2+}$-doped QD LSCs with different QD concentrations. The results of these calculations are shown in FIGS. 8 and 19, respectively.

Clear (untinted) architectural window glass typically has a VT of 82-90%. Therefore, for all concentrations of $Mn^{2+}$-doped QDs considered in FIG. 19 ($\eta_{s,abs}$ within 6%), the QD-LSCs can be qualified as clear architectural windows. Tinted architectural window glass has a lower VT in the range of 40-62%. CISe QD-LSCs with $\eta_{s,abs}$<20% (See FIG. 8) meet this requirement (VT>44%) and therefore can function as tinted architectural windows.

It will be readily understood that the components of various embodiments of the present invention, as generally described and illustrated in the figures herein, may be arranged and designed in a wide variety of different configurations. Thus, the detailed description of the embodiments of the present invention, as represented in the attached figures, is not intended to limit the scope of the invention as claimed, but is merely representative of selected embodiments of the invention.

The features, structures, or characteristics of the invention described throughout this specification may be combined in any suitable manner in one or more embodiments. For example, reference throughout this specification to "certain embodiments," "some embodiments," or similar language means that a particular feature, structure, or characteristic described in connection with the embodiment is included in at least one embodiment of the present invention. Thus, appearances of the phrases "in certain embodiments," "in some embodiment," "in other embodiments," or similar language throughout this specification do not necessarily all refer to the same group of embodiments and the described features, structures, or characteristics may be combined in any suitable manner in one or more embodiments.

It should be noted that reference throughout this specification to features, advantages, or similar language does not imply that all of the features and advantages that may be realized with the present invention should be or are in any single embodiment of the invention. Rather, language referring to the features and advantages is understood to mean that a specific feature, advantage, or characteristic described in connection with an embodiment is included in at least one embodiment of the present invention. Thus, discussion of the features and advantages, and similar language, throughout this specification may, but do not necessarily, refer to the same embodiment.

Furthermore, the described features, advantages, and characteristics of the invention may be combined in any suitable manner in one or more embodiments. One skilled in the relevant art will recognize that the invention can be practiced without one or more of the specific features or advantages of a particular embodiment. In other instances, additional features and advantages may be recognized in certain embodiments that may not be present in all embodiments of the invention.

One having ordinary skill in the art will readily understand that the invention as discussed above may be practiced with steps in a different order, and/or with hardware elements in configurations which are different than those which are disclosed. Therefore, although the invention has been described based upon these preferred embodiments, it would be apparent to those of skill in the art that certain modifications, variations, and alternative constructions would be apparent, while remaining within the spirit and scope of the invention. In order to determine the metes and bounds of the invention, therefore, reference should be made to the appended claims.

The invention claimed is:

1. A luminescent solar concentrator (LSC) device, comprising:
a lower band-gap energy bottom LSC layer; and a
higher band-gap energy top LSC layer positioned above the lower band-gap energy bottom LSC layer, wherein
the higher band-gap energy top LSC layer has a higher band-gap energy than the lower band-gap energy bottom LSC layer, and
the higher band-gap energy top LSC layer has a higher internal quantum efficiency (IQE) than the lower band-gap energy bottom LSC layer;
wherein the higher band-gap energy top LSC layer, the lower band-gap energy bottom LSC layer, or both, comprise quantum dots (QDs);
wherein the higher band-gap energy top LSC layer comprises one or more of the following: wide band-gap nanocrystals (NCs) selected from a group consisting of II-VI, III-V, I-III-VI2 semiconductors, all-inorganic perovskites and organic-inorganic hybrid perovskites comprising alloyed compounds prepared as spherical quantum dots (QDs), nanorods, nanoplatelets, tetrapods and combinations thereof;
heterostructured nanocrystals selected from a group consisting of I-VI, III-V, I-III-VI2 semiconductors, their alloys and combinations thereof, prepared as core/shell NCs, selected from heteronanorods, hetero-nanoplatelets, and/or hetero-tetrapods; and/or
NCs doped with emissive impurities;
wherein the higher band-gap energy top LSC layer comprises a group consisting of core/shell CdSe/CdS quantum dots (QDs), nanorods, and/or nanoplatelets, core/shell $Cd_xZn_{1-x}Se_yS_{1-y}/ZnSe_zS_{1-z}$ QDs, InP QDs, core/shell InP/ZnS QDs, Mn-doped $Cd_xZn_{1-x}Se_yS_{1-y}$ QDs, Mn-doped core/shell $Cd_xZn_{1-x}Se_yS_{1-y}/ZnSe_zS_{1-z}$ QDs, Cu-doped $Cd_xZn_{1-x}Se_yS_{1-y}$ QDs, Cu-doped core/shell $Cd_xZn_{1-x}Se_yS_{1-y}/ZnSe_zS_{1-z}$ QDs, or any combination thereof;
wherein the lower band-gap energy bottom LSC layer comprises nanocrystals of narrow band-gap semiconductors comprising CdTe, PbSe, PbS, $PbSe_xS_{1-x}$, CuInS$_2$, a CuInS$_2$—ZnS alloy, CuInSe$_2$, a CuInSe$_2$—ZnS alloy, CuInSe$_x$S$_{2-x}$, a CuInSe$_2$—ZnSeS alloy, AgInS$_2$, AgInSe$_2$, AgInSe$_x$S$_2$, Si, Ge, a SiGe alloy, and/or GaAs, any combination thereof, or heterostructures based on a combination of any of the previous materials with one or more wider band-gap materials comprising core/shell selected from the group consisting of PbSe/Cd Se QDs, PbS/CdS QDs, CuInS$_2$/ZnS QDs, CuInSe$_2$/ZnSe QDs, and/or CuInSe$_2$/ZnSe/ZnS QDs;

said bottom LSC layer comprising strong absorbance across the solar spectrum; said top LSC layer virtually reabsorption free and both layers exhibit high emission quantum yield (QY).

2. The LSC device of claim 1, further comprising:
a plurality of edge-mounted photovoltaics (PVs) mounted to respective edges of each LSC layer, wherein
the edge mounted PVs are band-gap-matched solar cells matched to the bandgaps of quantum dots (QDs) in a respective layer to which the respective PV is mounted.

3. The LSC device of claim 1, further comprising:
at least one additional LSC layer between the higher band-gap energy top LSC layer and the lower band-gap energy bottom LSC layer, the at least one additional LSC layer having a band-gap energy and an IQE that is between those of the higher band-gap energy top LSC layer and the lower band-gap energy bottom LSC layer.

4. The LSC device of claim 3, wherein the at least one additional layer comprises core-shell II-VI quantum dots (QDs) with shell greater than 4 nm in thickness comprising CdSe/CdS QDs, CdSe/Cd$_x$Zn$_{1-x}$ Se QDs, and/or Cd$_x$Zn$_{1-x}$Se$_y$S$_{1-y}$/ZnSe$_z$S$_{1-z}$ QDs, Cu-doped II-VI QDs, Cu-doped core-shell II-VI QDs, or any combination thereof.

5. The LSC device of claim 1, wherein the higher band-gap energy top LSG layer, the lower band-gap energy bottom LSC layer, or both, comprise quantum dots (QDs) coated with a ZnS shell.

6. The LSC device of claim 5 wherein the coated cores and the cores themselves have a tetrahedral shape.

7. The LSC device of claim 5 wherein the QDs have an absorption onset of 950 nm or more.

8. The luminescent solar concentrator (LSC) device according to claim 1 wherein the lower band gap energy bottom LSC layer is CuInSe$_x$S$_{2-x}$ QDs and the higher band-gap energy top LSC layer is Mn-doped Cd$_x$Zn$_{1-x}$ Se$_y$S$_{1-y}$ QDs.

9. The luminescent solar concentrator (LSC) device according to claim 1, wherein the bottom LSC layer comprises core-shell II-VI quantum dots (QDs) with an extra thick shell greater than 4 nm in thickness.

10. A luminescent solar concentrator (LSC) device comprising:
a lower band-gap energy bottom LSC layer;
a higher band-gap energy top LSC layer positioned above the lower band-gap energy bottom LSC layer, and
optionally, an intermediate band-gap energy intermediate LSC layer positioned between the lower band-gap energy bottom LSC layer and the higher band-gap energy top LSC layer, having a band-gap energy and an IQE in between those of the LSC layers above and below it, wherein the higher band-gap energy top LSC layer has a higher band-gap energy than the lower band-gap energy bottom LSC layer, and
the higher band-gap energy top LSC layer has a higher internal quantum efficiency (IQE) than the lower band-gap energy bottom LSC layer;
wherein the higher band-gap energy top LSC layer, the lower band-gap energy bottom LSC layer, or both, comprise quantum dots (QDs);
wherein the higher band-gap energy top LSC layer comprises one or more of the following: wide band-gap nanocrystals (NCs) selected from a group consisting of II-VI, III-V, I-III-VI2 semiconductors, all-inorganic perovskites and organic-inorganic hybrid perovskites comprising alloyed compounds prepared as spherical quantum dots (QDs), nanorods, nanoplatelets, tetrapods and combinations thereof;
heterostructured nanocrystals selected from a group consisting of II-VI, II-V, I-III-VI2 semiconductors, their alloys and combinations thereof, prepared as core/shell NCs, selected from heteronanorods, hetero-nanoplatelets, and/or hetero-tetrapods; and/or
NCs doped with emissive impurities;
wherein the lower band-gap energy bottom LSC layer comprises nanocrystals of narrow band-gap semiconductors comprising CdTe, PbSe, PbS, PbSe$_x$S$_{1-x}$, CuInS$_2$, a CuInS$_2$—ZnS alloy, CuInSe$_2$, a CuInSe$_2$—ZnS alloy, CuInSe$_x$S$_{2-x}$, a CuInSe$_2$—ZnSeS alloy, AgInS$_2$, AgInSe$_2$, AgInSe$_x$S$_2$, Si, Ge, a SiGe alloy, and/or GaAs, any combination thereof, or heterostructures based on a combination of any of the previous materials with one or more wider band-gap materials comprising core/shell selected from the group consisting of PbSe/Cd Se QDs, PbS/CdS QDs, CuInS$_2$/ZnS QDs, CuInSe$_2$/ZnSe QDs, and/or CuInSe$_2$ZnSe/ZnS QDs;
wherein the higher band-gap energy top LSC layer comprises a group consisting of core/shell CdSe/CdS quantum dots (QDs), nanorods, and/or nanoplatelets, core/shell Cd$_x$Zn$_{1-x}$Se$_y$S$_{1-y}$/ZnSe$_z$S$_{1-z}$ QDs, InP QDs, core/shell InP/ZnS QDs, Mn-doped Cd$_x$Zn$_{1-x}$ Se$_y$S$_{1-y}$ QDs, Mn-doped core/shell Cd$_x$Zn$_{1-x}$ Se$_y$S$_{1-y}$/ZnSe$_z$S$_{1-z}$ QDs, Cu-doped Cd$_x$Zn$_{1-x}$ Se$_y$S$_{1-y}$/QDs, Cu-doped core/shell Cd$_x$Zn$_{1-x}$ Se$_y$S$_{1-y}$/ZnSe$_z$S$_{1-z}$ QDs, or any combination thereof;
wherein the intermediate band-gap energy intermediate LSC layer comprises core-shell II-VI quantum dots (QDs) with shell greater than 4 nm in thickness comprising CdSe/CdS QDs, CdSe/Cd$_x$Zn$_{1-x}$ Se QDs, and/or Cd$_x$Zn$_{1-x}$ Se$_y$S$_{1-y}$/ZnSe$_z$S$_{1-z}$ QDs, Cu-doped II-VI QDs, Cu-doped core-shell II-VI QDs, or any combination thereof;
said bottom LSC layer comprising strong absorbance across the solar spectrum; said top LSC layer virtually reabsorption free and both layers exhibit high emission quantum yield (QY).

11. The luminescent solar concentrator (LSC) device according to claim 1, wherein the emission quantum yield is at least 80-88%.

* * * * *